(12) United States Patent
Jang et al.

(10) Patent No.: US 9,202,997 B2
(45) Date of Patent: Dec. 1, 2015

(54) SEMICONDUCTOR NANOCRYSTAL-POLYMER MICRONIZED COMPOSITE, METHOD OF PREPARING THE SAME, AND OPTOELECTRONIC DEVICE

(71) Applicant: SAMSUNG ELECTRONICS CO., LTD., Suwon-si, Gyeonggi-do (KR)

(72) Inventors: Hyo-Sook Jang, Hwaseong-si (KR); Hyun-A Kang, Suwon-si (KR); Eun-Joo Jang, Suwon-si (KR); Shin Ae Jun, Seongnam-si (KR); Tae Won Jeong, Yongin-si (KR); In Taek Han, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 13/661,956

(22) Filed: Oct. 26, 2012

(65) Prior Publication Data

US 2013/0105854 A1  May 2, 2013

(30) Foreign Application Priority Data

Oct. 28, 2011  (KR) .................. 10-2011-0111540

(51) Int. Cl.
*B32B 5/16* (2006.01)
*B05D 7/00* (2006.01)
*H01L 33/56* (2010.01)
(Continued)

(52) U.S. Cl.
CPC ............... *H01L 33/56* (2013.01); *C09C 3/006* (2013.01); *C09C 3/10* (2013.01); *H01L 33/502* (2013.01); *H01L 33/501* (2013.01); *H01L 33/507* (2013.01);
(Continued)

(58) Field of Classification Search
CPC ........ C09C 3/006; C09C 3/10; C09C 3/063; C09C 3/12; C23C 8/00; C23C 2222/00; C01P 2004/51; C01P 2004/54; C01P 2004/61; C01G 99/00; B82Y 30/00; B82B 1/008; Y10T 428/2998
USPC .................. 428/403–407; 427/215, 220, 221
See application file for complete search history.

(56) References Cited

U.S. PATENT DOCUMENTS 6,309,701 B1 * 10/2001 Barbera-Guillem ....... 427/213.3
6,548,171 B1 *  4/2003 Barbera-Guillem et al. ........................ 428/402.24
(Continued)

FOREIGN PATENT DOCUMENTS

KR       1020080014079 A     2/2008

OTHER PUBLICATIONS

Zhu, Y.G. et al., Structural Changes in Poly(ethylene terephthalate) Induced by Cryomilling and Ambimilling, J. of Polymer Science Part B: Polymer Physics, 2006, vol. 44 (6): 986-993.

*Primary Examiner* — Holly Le
(74) *Attorney, Agent, or Firm* — Cantor Colburn LLP

(57) ABSTRACT

A semiconductor nanocrystal-polymer micronized composite that includes: at least one semiconductor nanocrystal; and a polymer surrounding the at least one semiconductor nanocrystal, wherein the polymer includes at least one functional group reactive with the semiconductor nanocrystal, and wherein the semiconductor nanocrystal-polymer micronized composite has a particle diameter of less than or equal to about 70 micrometers (μm) with a standard deviation of less than or equal to about 20 micrometers (μm), and an aspect ratio of more than about 1.0 and less than or equal to about 10.

25 Claims, 14 Drawing Sheets

(51) Int. Cl.
  *C09C 3/00* (2006.01)
  *C09C 3/10* (2006.01)
  *H01L 33/50* (2010.01)

(52) U.S. Cl.
  CPC ...... *Y10T 428/2989* (2015.01); *Y10T 428/2998* (2015.01)

(56) References Cited

U.S. PATENT DOCUMENTS

| | | |
|---|---|---|
| 7,135,231 B1 | 11/2006 | Sinclair et al. |
| 7,172,811 B2 * | 2/2007 | Denisyuk et al. ............ 428/402 |
| 8,865,797 B2 * | 10/2014 | Matyjaszewski et al. .... 523/205 |
| 2002/0045045 A1 * | 4/2002 | Adams et al. ................. 428/403 |
| 2006/0019098 A1 * | 1/2006 | Chan et al. .................... 428/403 |
| 2006/0060862 A1 * | 3/2006 | Bawendi et al. ................ 257/76 |
| 2006/0088713 A1 * | 4/2006 | Dykstra et al. ................ 428/402 |
| 2006/0290000 A1 | 12/2006 | Worwag et al. |
| 2007/0045777 A1 * | 3/2007 | Gillies et al. .................. 257/613 |
| 2007/0131905 A1 * | 6/2007 | Sato et al. ................ 252/301.16 |
| 2009/0047773 A1 | 2/2009 | Mitchell et al. |
| 2009/0145330 A1 | 6/2009 | Draper et al. |
| 2010/0172789 A1 | 7/2010 | Calla et al. |
| 2010/0249271 A1 * | 9/2010 | Matyjaszewski et al. .... 523/205 |
| 2013/0112942 A1 * | 5/2013 | Kurtin et al. .................... 257/13 |

* cited by examiner

SEMICONDUCTOR NANOCRYSTAL-POLYMER MICRONIZED COMPOSITE, METHOD OF PREPARING THE SAME, AND OPTOELECTRONIC DEVICE

CROSS-REFERENCE TO RELATED APPLICATION

This application claims priority to Korean Patent Application No. 10-2011-0111540, filed on Oct. 28, 2011, and all the benefits accruing therefrom under 35 U.S.C. §119, the content of which in its entirety is herein incorporated by reference.

BACKGROUND

1. Field

This disclosure relates to a semiconductor nanocrystal-polymer micronized composite, a method of preparing the same, and an optoelectronic device including the same.

2. Description of the Related Art

Semiconductor nanocrystals, which are also called quantum dots, are a semiconductor material with a nano-size and crystalline structure, and include hundreds to thousands of atoms.

The semiconductor nanocrystals are very small and thus have a large surface area per unit volume, and also have a quantum confinement effect. Accordingly, they have unique physicochemical properties that differ from the inherent characteristics of a corresponding bulk semiconductor material.

In particular, since optoelectronic properties of nanocrystals may be controlled by adjusting their size, the semiconductor nanocrystals are the subject of active research, and are being utilized in display devices and a variety of biotechnology applications.

In addition, a semiconductor nanocrystal-polymer composite including a matrix, in which a semiconductor nanocrystal is dispersed, by mixing a semiconductor nanocrystal with a matrix precursor and curing the matrix precursor, can be prepared and used in a variety of applications. The matrix mainly includes a silicone resin. The silicone resin may be incompatible with an organic ligand on the surface of the semiconductor nanocrystal. Thus, the semiconductor nanocrystals may be agglomerated and the organic ligand on the surface may be compromised or detached, resultantly deteriorating efficiency of a device. In addition, semiconductor nanocrystals are not uniformly dispersed in the matrix, deteriorating uniform efficiency of a device and thus its reliability.

When semiconductor nanocrystals are used in a display element or the like, a silicone polymer may be used as a matrix resin for dispersing the semiconductor nanocrystals, as described above. However, since the silicone resin may be incompatible with the organic ligand present on a surface of semiconductor nanocrystals, the semiconductor nanocrystals may be aggregated, and the organic ligand present on a surface of semiconductor nanocrystals may be compromised or detached, deteriorating efficiency of the device.

SUMMARY

An embodiment of this disclosure provides a semiconductor nanocrystal-polymer micronized composite effectively protecting semiconductor nanocrystals and improving efficiency and thermal stability of a device.

Another embodiment of this disclosure provides a method of preparing the semiconductor nanocrystal-polymer micronized composite.

Yet another embodiment of this disclosure provides an optoelectronic device including the semiconductor nanocrystal-polymer micronized composite.

According to an embodiment of this disclosure, provided is a semiconductor nanocrystal-polymer micronized composite that includes at least one semiconductor nanocrystal; and a polymer surrounding the at least one semiconductor nanocrystal, wherein the polymer includes at least one functional group reactive with the semiconductor nanocrystal. The semiconductor nanocrystal-polymer micronized composite has a particle diameter of less than or equal to about 70 micrometers (μm) with a standard deviation of less than or equal to about 20 micrometers (μm), and an aspect ratio of greater than about 1.0 and less than or equal to about 10.

Specifically, the semiconductor nanocrystal-polymer micronized composite may have a particle diameter of about 5 micrometers (μm) to about 65 micrometers (μm) with a standard deviation of less than or equal to about 15 micrometers (μm), and an aspect ratio of about 1.2 to about 5.0.

The semiconductor nanocrystal may be selected from a Group II-VI compound, a Group III-V compound, a Group IV-VI compound, and a combination thereof. The functional group reactive with the semiconductor nanocrystal may be selected from a carboxyl group (—C(=O)OH), an ester group (—C(=O)OR' wherein R' is a monovalent organic functional group), a carboxylic salt group (—C(=O)OM wherein M is a monovalent to trivalent metal ion), an alkylene ester group (—RC(=O)OR', wherein R is a substituted or unsubstituted C1 to C10 alkylene group, and R' is hydrogen, a monovalent organic functional group, or a monovalent to trivalent metal ion), a substituted or unsubstituted C2 to C20 alkenyl group, a substituted or unsubstituted C2 to C20 alkynyl group, a halogen, an alkyleneoxy group (—ROR', wherein R is a substituted or unsubstituted C1 to C10 alkylene group, and R' is hydrogen, a monovalent organic functional group, or a monovalent to trivalent metal ion), an acyl halide group (—RC(=O)X, wherein R is a substituted or unsubstituted C1 to C10 alkylene group, and X is a halogen), an amide group (—C(=O)NR', wherein R' is hydrogen, a monovalent organic functional group, or a monovalent to trivalent metal ion), an amine group (—NR'R", wherein R' and R" are each independently hydrogen, a monovalent organic functional group, or a monovalent to trivalent metal ion), an imine group (—C(=NR'), wherein R' is hydrogen, a monovalent organic functional group, or a monovalent to trivalent metal ion), an imide group (—C(=O)N(R')C(=O), wherein R' is hydrogen, a monovalent organic functional group, or a monovalent to trivalent metal ion), an isocyanate group (—N=C=O), an acrylate group (—OC(=O)—C(H)=CH$_2$), a methacrylate group (—OC(=O)—C(CH$_3$)=CH$_2$), a thiol group (—SH), a phosphine oxide group (—P(=O)R'R", wherein R' and R" are each independently hydrogen, a monovalent organic functional group, or a monovalent to trivalent metal ion), a sulfonate group (—SO$_3$R', wherein R' is hydrogen, a monovalent organic functional group, or a monovalent to trivalent metal ion), a nitro group (—NO$_2$), and a combination thereof.

The polymer may include a main chain selected from a polyacrylate, a polymethacrylate, a polyacrylic acid, a polyacrylic acid salt, a polymethacrylic acid, a polymethacrylic acid salt, a polyolefin, a poly(alkylene-co-acrylic acid), a poly(alkylene-co-acrylic acid salt), a poly(alkylene-co-methacrylic acid), a poly(alkylene-co-methacrylic acid salt), a polyamide, a polyimide, a polyisocyanate, a polythiol, a polyester, a polyamideimide, a polyetherimide, a polyacrylonitrile, a polyarylene ether, a polyarylene sulfide, a polyarylene sulfone, a polybenzoxazole, polybenzothiazole, a polybutadiene, a polycarbonate, a polycarbonate ester, a polyether ketone, a polyether ether ketone, a polyether ketone ketone, a polyethersulfone, a polyisoprene, a polyphosphazene, a polystyrene, a rubber-modified polystyrene, a polyoxadiazole, a polysilazane, polysulfone, a polysulfonamide, a polyvinyl acetate, a polyvinyl chloride, a polyvinyl ester, a polyvinyl ether, a polyvinyl halide, a polyvinyl nitrile, a polyvinyl thioether, a polyurea, a polyurethane, an epoxy, an ethylene propylene diene rubber, ethylene propylene diene monomer rubber, a melamine, a silicone, and a combination thereof.

The polymer may have a Shore D hardness of greater than about 20 and less than or equal to about 90 measured according to ASTM D2240-05.

The polymer may have a Shore D harness of greater than or equal to about 25 and less than or equal to about 70 measured according to ASTM D2240-05.

The semiconductor nanocrystal-polymer micronized composite may include about 1 to about 50 weight percent (wt %) of the at least one semiconductor nanocrystals, based on the total weight of the semiconductor nanocrystal-polymer micronized composite. The semiconductor nanocrystal-polymer micronized composite may further include an encapsulation polymer surrounding the semiconductor nanocrystal-polymer micronized composite. The encapsulation polymer may include a plurality of the semiconductor nanocrystal-polymer micronized composites therein.

The encapsulation polymer may be selected from a silicone resin; an epoxy resin; a poly(meth)acrylate polymer; an organic/inorganic hybrid polymer; a polycarbonate; a polystyrene; a polyolefin such as polyethylene, polypropylene, polyisobutylene, and the like; a copolymer of a first monomer including at least two thiol (—SH) groups and a second monomer including at least two carbon-carbon unsaturated bond-containing groups; and a combination thereof. The organic/inorganic hybrid polymer may include a first moiety including a siloxane bond (—Si—O—Si—), a second moiety including a siloxane bond and at least one organic functional group, and a third moiety including a siloxane bond and the cross-linked structure of at least one reactive functional group.

The organic/inorganic hybrid polymer may further include a fourth moiety including an —O-M-O— bond (wherein M is selected from Al, Sn, Ti, Zr, Ge, B, and a combination thereof).

According to another embodiment, provided is a method of preparing a semiconductor nanocrystal-polymer micronized composite which includes: providing a polymer solution including a polymer; adding a semiconductor nanocrystal to the polymer solution to react the semiconductor nanocrystal with the polymer to form a reaction product; filtering the reaction product; drying the reaction product; and cryogenic milling the dried reaction product to provide a semiconductor nanocrystal-polymer micronized composite, wherein the polymer includes at least one functional group reactive with the semiconductor nanocrystal, and the semiconductor nanocrystal-polymer micronized composite has a particle diameter of less than or equal to about 70 micrometers (µm), with a standard deviation of less than or equal to about 20 micrometers (µm), and an aspect ratio of greater than about 1.0 and less than or equal to about 10.

The semiconductor nanocrystal, polymer, and functional group are the same as described above.

The method may further include raising a temperature of the semiconductor nanocrystal-polymer micronized composite obtained from the cryogenic milling, from the cryogenic milling temperature to a temperature of about 23 degrees Celsius (° C.) to about 25 degrees Celsius, (° C.); and sieving the semiconductor nanocrystal-polymer micronized composite having the raised temperature. In addition, the method may further include a secondary (i.e., additional) cryogenic milling process after the semiconductor nanocrystal-polymer micronized composite is obtained. In an embodiment the secondary cryogenic milling is conducted after the semiconductor nanocrystal-polymer micronized composite from the first cryogenic milling is mixed with an encapsulation polymer. The cryogenic milling process may be performed at about 10 kelvin (K) to about 273 kelvin (K). The cryogenic milling may be performed at about 10 kelvin (K) to about 150 kelvin (K).

Another embodiment of this disclosure provides an optoelectronic device including the semiconductor nanocrystal-polymer micronized composite.

The optoelectronic device may be a light emitting device which includes: a light source; and a light converting layer disposed on the light source, wherein the light converting layer includes a matrix, and the semiconductor nanocrystal-polymer micronized composite dispersed in the matrix. The semiconductor nanocrystal-polymer micronized composite is the same as described above.

The optoelectronic device may include one or more of the semiconductor nanocrystal-polymer micronized composite provides a second composite surrounded by an encapsulation polymer to provide an encapsulated composite, and the encapsulated composite may be dispersed in the matrix.

The encapsulation polymer is the same as described above.

The optoelectronic device may be a light emitting device that includes: a light source; a first matrix disposed on the light source; a transparent plate disposed on the first matrix layer opposite the light source; and a light converting layer disposed on the transparent plate opposite the first matrix layer, wherein the light converting layer includes a second matrix and a semiconductor nanocrystal-polymer micronized composite dispersed in the second matrix.

The light emitting device may further include an outer polymer film disposed on the light converting layer opposite the transparent plate, wherein the outer polymer film may include a polymerized product of a first monomer including at least two thiol (—SH) groups, and a second monomer including at least two carbon-carbon unsaturated bond-containing groups.

The light emitting device may further include an outer polymer film disposed on the light converting layer opposite the transparent plate, and an inner polymer film disposed between the outer polymer film and the light converting layer. The inner polymer film may include a polymerized product of a first monomer including at least two thiol (—SH) groups and a siloxane-based second monomer or oligomer including at least one carbon-carbon unsaturated bond, and the outer polymer film may include a polymerized product of a third monomer including at least two thiol (—SH) groups and a fourth monomer including at least two carbon-carbon unsaturated bonds.

Embodiments of this disclosure will be further described in the following detailed description.

BRIEF DESCRIPTION OF THE DRAWINGS

The above and other aspects, advantages and features of this disclosure will become more apparent by describing in further detail embodiments thereof with reference to the accompanying drawings.

DETAILED DESCRIPTION

Figure 1:
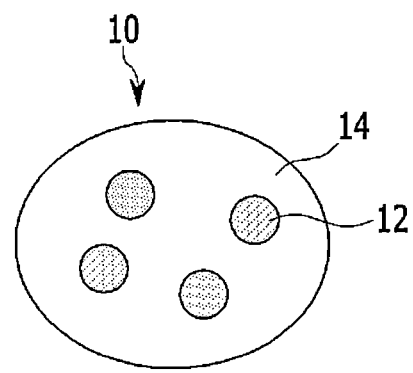
FIG. 1 is a schematic view showing a semiconductor nanocrystal-polymer micronized composite according to an embodiment as disclosed herein.

This disclosure will be described more fully hereinafter with reference to the accompanying drawings, in which various embodiments are shown. This disclosure may however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the drawings, the thickness of layers, films, panels, regions, etc., are exaggerated for clarity.

It will be understood that when an element such as a layer, film, region, or substrate is referred to as being "on" another element, it can be directly on the other element or intervening elements may be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms as well, including "at least one," unless the content clearly indicates otherwise. "Or" means "and/or." It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning consistent with their meaning in the context of the relevant art and the present disclosure, and will not be interpreted in an idealized or overly formal sense unless expressly so defined herein.

As used herein, when a definition is not otherwise provided, the term "substituted" refers to a compound or group substituted with a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (specifically the halogens selected from —F, —Cl, —Br, or —I), a hydroxy group (—OH), a nitro group (—NO$_2$), a cyano group (—CN), an amino group (—NRR', wherein R and R' are hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR wherein R is a C1 to C6 alkyl group or a C6 to C12 aryl group), a carboxyl group (—C(=O)OH) or a salt thereof (—C(=O)OM wherein M is an organic or inorganic cation), a sulfonic acid group (—SO$_3$H) or a salt thereof (—SO$_3$M wherein M is an organic or inorganic cation), a phosphoric acid group (—PO$_3$H$_2$) or a salt thereof (—PO$_3$MH or —PO$_3$M$_2$ wherein M is an organic or inorganic cation), instead of hydrogen, provided that the substituted atom's normal valence is not exceeded.

Throughout the present disclosure, reference is made to various heterocyclic groups. Within such groups, the prefix "hetero" refers to a group that includes at least one ring member (e.g., 1 to 4 ring members) that is a heteroatom (e.g., 1 to 4 heteroatoms, each independently N, O, S, Si, or P).

An "alkyl" group is a straight or branched saturated aliphatic hydrocarbon group having the specified number of carbon atoms and having a valence of at least one, optionally substituted with one or more substituents where indicated, provided that the valence of the alkyl group is not exceeded.

An "alkenyl" group is a straight or branched chain hydrocarbon that comprises at least one carbon-carbon double bond and having a valence of at least one, optionally substituted with one or more substituents where indicated, provided that the valence of the alkenyl group is not exceeded.

An "alkynyl" group is a straight or branched chain, monovalent hydrocarbon group having at least one carbon-carbon triple bond (e.g., ethynyl).

As used herein, the term "alkylene" group refers to a straight or branched saturated aliphatic hydrocarbon group having a valence of at least two, optionally substituted with one or more substituents where indicated, provided that the valence of the alkylene group is not exceeded.

An "aryl" group is a cyclic group in which all ring members are carbon and at least one ring is aromatic, the group having the specified number of carbon atoms, and having a valence of at least one, optionally substituted with one or more substituents where indicated, provided that the valence of the aryl group is not exceeded. More than one ring may be present, and any additional rings may be independently aromatic, saturated or partially unsaturated, and may be fused, pendant, spirocyclic, or a combination thereof.

The term "arylene" group refers to a divalent radical formed by the removal of two hydrogen atoms from one or more rings of an aromatic hydrocarbon, wherein the hydrogen atoms may be removed from the same or different rings, each of which rings may be aromatic or nonaromatic.

An "alkylaryl" group is an alkyl group as defined above, covalently linked to a substituted or unsubstituted aryl group, as defined above, with the point of attachment to a compound on the aryl group.

An "alkoxy" group is an alkyl group as defined above, linked via an oxygen, e.g. alkyl-O—.

An "aryloxy" group is an aryl group as defined above, linked via an oxygen, e.g. aryl-O—.

As used herein, the term "aliphatic organic group" refers to a linear or branched C1 to C30 alkyl group, the term "aromatic organic group" refers to a C6 to C30 aryl group or a C2 to C30 heteroaryl group, and the term "alicyclic organic group" refers to a C3 to C30 cycloalkyl group, a C3 to C30 cycloalkenyl group, or a C3 to C30 cycloalkynyl group.

A "carbonylalkyl" group is an alkyl group as defined above, linked via a carbonyl group, and a "carbonylalkoxy" group is an alkoxy group as defined above, linked via a carbonyl group.

A "cycloalkyl" group is a group that comprises one or more saturated and/or partially saturated rings in which all ring members are carbon, such as cyclopropyl, cyclobutyl, cyclopentyl, cyclohexyl, cycloheptyl, cyclooctyl, adamantyl and partially saturated variants of the foregoing, such as cycloalkenyl groups (e.g., cyclohexenyl) or cycloalkynyl groups, and having a valence of at least one, and optionally substituted with one or more substituents where indicated, provided that the valence of the alkyl group is not exceeded. Cycloalkyl groups do not include an aromatic ring or a heterocyclic ring. When the numbers of carbon atoms is specified (e.g., C3 to C15 cycloalkyl), the number means the number of ring members present in the one or more rings.

A "cycloalkenyl" group is monovalent group having one or more rings and one or more carbon-carbon double bond in the ring, wherein all ring members are carbon (e.g., cyclopentyl and cyclohexyl).

A "cycloalkynyl" group is a stable aliphatic monocyclic or polycyclic group having at least one carbon-carbon triple bond, wherein all ring members are carbon (e.g., cyclohexynyl).

As used herein, the term "carbon-carbon unsaturated bond-containing substituent" includes a C2 to C20 alkenyl group including at least one carbon-carbon double bond, a C2 to C20 alkynyl group including at least one carbon-carbon triple bond, a C4 to C20 cycloalkenyl group including at least one carbon-carbon double bond in a ring, or a C4 to C20 cycloalkynyl group including at least one carbon-carbon triple bond in a ring.

As used herein, the term "combination thereof" refers to a mixture, a stacked structure, a composite, an alloy, a blend, a reaction product, or the like, or a combination comprising at least one of the named constituents, components, compounds, or elements, optionally together with one or more of the same class of constituents, components, compounds, or elements.

As used herein, (meth)acrylate refers to an acrylate group ($H_2C=CH—C(=O)O—$) and a methacrylate group ($H_2C=C(CH_3)—C(=O)—$), and (meth)acryloxy refers to an acryloxy group and a methacryloxy group.

Hereinafter, referring to FIG. 1, the semiconductor nanocrystal-polymer micronized composite according to an embodiment is described in detail.

FIG. 1 is a schematic view showing a semiconductor nanocrystal-polymer micronized composite according to an embodiment.

Referring to FIG. 1, the semiconductor nanocrystal-polymer micronized composite 10 according to an embodiment includes at least one semiconductor nanocrystal 12, and a polymer 14 surrounding the at least one semiconductor nanocrystal 12. As shown, more than one semiconductor nanocrystal 12 can be present in a micronized composite particle. The semiconductor nanocrystal-polymer micronized composite 10 has a size, i.e., a particle diameter of less than or equal to about 70 micrometers (µm) with a standard deviation of less than or equal to about 20 µm, and an aspect ratio of greater than about 1.0 and less than or equal to about 10, specifically, a particle diameter of about 5 µm to about 65 µm, a standard deviation of less than or equal to about 15 µm, and an aspect ratio of about 1.2 to about 5.0, and more specifically a particle diameter of about 5 µm to about 50 µm with a standard deviation of less than or equal to about 12 µm, and an aspect ratio of about 1.2 to about 3.5. As used herein, "particle diameter" refers to the longest particle dimension, and may therefore be used in connection with irregularly shaped particles. The semiconductor nanocrystal-polymer composite 10 may have any shape, although due to the method of producing the particles, the shapes are generally spherical or ovoid, for example. The semiconductor nanocrystal-polymer micronized composite 10 exists as micronized particles and may be stably stored. The particles are uniformly distributed within nanocrystal-polymer micronized composite 10, and thus provide a light emitting device having uniform luminance. The semiconductor nanocrystal 12 is uniformly dispersed in a polymer 14, and may be prevented from aggregation therein.

The semiconductor nanocrystal 12 may include a Group II-VI compound, a Group III-V compound, a Group IV-VI compound, and a combination thereof, wherein the term "Group" refers to a group in the Periodic Table of the Elements.

The Group II-VI compound includes a binary compound selected from CdSe, CdTe, ZnS, ZnSe, ZnTe, ZnO, HgS, HgSe, HgTe, MgSe, MgS, and a combination thereof; a ternary compound selected from CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. The Group III-V compound includes a binary compound selected from GaN, GaP, GaAs, GaSb, AlN, AlP, AlAs, AlSb, InN, InP, InAs, InSb, and a combination thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof; or a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group IV-VI compound includes a binary compound selected from SnS, SnSe, SnTe, PbS, PbSe, PbTe, and a combination thereof; a ternary compound selected from SnSeS, SnSeTe, SnSTe, PbSeS, PbSeTe, PbSTe, SnPbS, SnPbSe, SnPbTe, and a combination thereof; or a quaternary compound selected from SnPbSSe, SnPbSeTe, SnPbSTe, and a combination thereof.

According to an embodiment, the element, the binary compound, the ternary compound, or the quaternary compound, or a combination thereof, may be in the form of a particle or may be present in a particle in a substantially uniform or different concentration, for example a gradient.

In addition, each particle may have a core/shell structure in which a first semiconductor nanocrystal is surrounded by a second semiconductor nanocrystal. The core and shell may have an interface, and an element of at least one of the core or the shell may have a concentration gradient that decreases in a direction from the surface of the particle to the center of the particle.

In addition, the semiconductor nanocrystal 12 may have a structure including a semiconductor nanocrystal core and a multi-layer shell surrounding the same. The multi-layer shell may have a two or more layered shell structure. Each layer may have a single composition or an alloy or concentration gradient.

In addition, the semiconductor nanocrystal 12 may have a structure effectively showing the quantum confinement effect, since the shell has a material composition with a higher energy band gap than that of the core. When the semiconductor nanocrystal has a multi-layered shell, the energy band gap of the shell disposed on the exterior of the core may be higher than the shell closer to the core. The semiconductor nanocrystal may have an ultraviolet ("UV") to infrared wavelength range.

The semiconductor nanocrystal 12 may have quantum efficiency of about 30% to about 100%, for example, about 50% or more, or about 70% or more, or about 90% or more. Within this range, the semiconductor nanocrystal 12 may improve the luminous efficiency of a device.

In addition, the full width of half maximum ("FWHM") of the light emitting wavelength spectrum of the semiconductor nanocrystal 12 may be selected to be narrower or wider according to the application field. It may have a narrower spectrum in order to improve the color purity or the color reproducibility in a display. In this regard, the semiconductor nanocrystal 12 may have the FWHM of light emitting wavelength spectrum of about 50 nanometers (nm) or less, for example, about 40 nm or less, or about 30 nm or less. In the foregoing range, the semiconductor nanocrystal 12 may improve the color purity or the color reproducibility of a device.

The semiconductor nanocrystal 12 may have a particle diameter (e.g., an average largest particle diameter) of about 1 nanometer (nm) to about 100 nm, specifically, about 1 nm to about 20 nm, more specifically about 1 nm to about 10 nm.

In addition, the semiconductor nanocrystal 12 may have a generally-used shape in this art, but the shape is not specifically limited thereto. Examples thereof may include a spherical, a pyramidal, a multi-arm, or a cubic nanoparticle, a nanotube, a nanowire, a nanofiber, a nanoplate particle, or the like.

The semiconductor nanocrystal 12 may be synthesized according to the general methods known in this art. For example, the semiconductor nanocrystal may be synthesized according to the following method. The method of a synthesizing the semiconductor nanocrystal is not limited to the following method and the semiconductor nanocrystal may be synthesized according to any conventional method known in the arts.

For example, several nano-sized semiconductor nanocrystals may be synthesized according to a wet chemical process in which a precursor material is added to an organic solvent to develop particles. The method controls crystal development by naturally coordinating an organic solvent or an organic ligand on the surface of the semiconductor nanocrystal while the crystal is developed. Excessive organic material (solvent and ligand) not coordinated on the surface of the semiconductor nanocrystal may be removed during centrifugation after washing three times. After removing the excessive organic material, the amount of organic material coordinated on the surface of the nanocrystal may be present in an amount of about 50 weight percent ("wt %") or less based on the total weight of the semiconductor nanocrystal. With a nanocrystal size of about 20 nm or less, the organic material is coordinated in a range of about 10 wt % to about 50 wt %, for example, about 15 wt % to about 30 wt %, based on the total weight of the semiconductor nanocrystal. The organic ligand may be a monomer or an oligomer having a molecular weight of about 300 grams/mole or more or a polymer having a molecular weight ("Mw") of about 5000 grams/mole or more.

It is known that a semiconductor nanocrystal-polymer composite including a matrix in which the synthesized semiconductor nanocrystal is dispersed may be prepared by mixing a semiconductor nanocrystal with a matrix precursor and curing the matrix precursor. The semiconductor nanocrystal-polymer composite may be applied in various fields. The matrix may be a variety of polymers, but mainly includes a silicone resin. The silicone resin has poor compatibility with the organic ligand on the surface of the semiconductor nanocrystal. Thus, the semiconductor nanocrystals may become agglomerated and lose the organic ligand on the surface, resultantly deteriorating the efficiency of a device. In addition, semiconductor nanocrystals made by this method are not uniformly dispersed in the matrix, deteriorating the uniformity of the efficiency or performance of a device and thus its reliability. According to an embodiment, and referring to FIG. 1, the semiconductor nanocrystal 12 is combined with a polymer 14 having at least one functional group at a terminal end or main chain of the polymer. The functional group of the polymer may react with the semiconductor nanocrystal 12 and thus micronize the semiconductor nanocrystal 12 into particles, increasing dispersion of the semiconductor nanocrystal micronized particles in a polymer, to provide a semiconductor nanocrystal-polymer micronized composite.

The at least one functional group reactive with the semiconductor nanocrystal 12 may be selected from a carboxyl group (—C(=O)OH), an ester group (—C(=O)OR', wherein R' is a monovalent organic functional group, or a monovalent to trivalent metal ion), an alkylene ester group (—RC(=O)OR', wherein R is a substituted or unsubstituted C1 to C10 alkylene group, and R' is hydrogen, a monovalent organic functional group, or a monovalent to trivalent metal ion), a substituted or unsubstituted C2 to C20 alkenyl group, a substituted or unsubstituted C2 to C20 alkynyl group, a halogen, an —ROR' group (wherein R is a substituted or unsubstituted C1 to C10 alkylene group, and R' is hydrogen, a monovalent organic functional group, or a monovalent to trivalent metal ion), an acyl halide group (—RC(=O)X, wherein R is a substituted or unsubstituted C1 to C10 alkylene group, and X is a halogen (specifically a halogen selected from —F, —Cl, —Br, or —I)), an amide group (—C(=O) NR', wherein R' is hydrogen, a monovalent organic functional group, or a monovalent to trivalent metal ion), an amine group (—NR'R", wherein R' and R" are each independently hydrogen, a monovalent organic functional group, or a monovalent to trivalent metal ion), an imine group (C(=NR'), wherein R' is hydrogen, a monovalent organic functional group, or a monovalent to trivalent metal ion), an imide group (—C(=O) N(R')C(=O), wherein R' is hydrogen, a monovalent organic functional group, or a monovalent to trivalent metal ion), an isocyanate group (—N=C=O), an acrylate group (—OC (=O)—C(H)=CH$_2$), a methacrylate group (—OC(=O)— C(CH$_3$)=CH$_2$), a thiol group (—SH), a phosphine oxide group (—P(=O)R'R", wherein R' and R" are each independently hydrogen, a monovalent organic functional group, or a monovalent to trivalent metal ion), a sulfonate group (—SO$_3$R', wherein R' is hydrogen, a monovalent organic functional group, or a monovalent to trivalent metal ion), a nitro group —NO$_2$, and a combination thereof. The polymer 14 includes the at least one functional group at any location in the polymer, for example at a terminal end (including a terminal end of a graft) or on the backbone of the main chain or a graft. While not wishing to be bound by theory, it is believed the polymer including the at least one functional group, may stably passivate the semiconductor nanocrystal 12.

Thus, a functional group "reactive" with the semiconductor nanocrystal may or may not include the formation of a covalent bond, ionic bond, or hydrogen bond, coordination with functional group or other groups in the polymer, or other interaction that improves the dispersion of the semiconductor nanocrystals 12 in the polymer, so as to prevent agglomeration of the semiconductor nanocrystal 12. For example, and without being bound by theory, the monovalent to trivalent metal ions may have an ionic bond with the functional group. The divalent or trivalent metal ions may react with a functional group having a divalence or more to form a coordination bond, or the divalent or trivalent metal ions may be combined with a surface of a semiconductor nanocrystal or an organic ligand on the surface of the semiconductor nanocrystal, and thus be stabilized. The monovalent metal ion may be a cation of an alkali metal, for example, $Na^+$, $K^+$, and the like. Examples of the divalent or trivalent metal ion may include a cation of a metal such as Zn, Cd, Mg, In, Ga, Al, Ca, Sc, Ti, V, Cr, Mn, Fe, Co, Ni, Cu, Zn, Sr, Y, Zr, Nb, Mo, Cd, Ba, Au, Hg, Tl, and the like.

The monovalent organic functional group may be selected from a C1 to C30 alkyl group, a C2 to C30 alkenyl group, a C2 to C30 alkynyl group, a C6 to C30 aryl group, a C7 to C30 an alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group. In another embodiment the functional group is a group including a monovalent to trivalent metal ion, for example a carboxy group —C(=O)OR', wherein R' is a monovalent organic functional group, or a monovalent to trivalent metal ion.

The polymer 14 may include a main chain selected from a wide variety of polymer types, provided that the polymer can be suitably functionalized with the functional group reactive with the semiconductor nanocrystal; can be processed to form the composite containing the semiconductor nanocrystal and the polymer; and is suitable for use in an intended device, for example an optoelectronic device. For example as described below, the polymers may be selected to be soluble in a solvent so as to facilitate reaction with the semiconductor nanocrystal. When the semiconductor nanocrystal-polymer micronized composite is to be dispersed in a matrix, the polymer is selected to be compatible with the matrix.

The polymer 14 may be a polyacrylate, a polymethacrylate, a polyacrylic acid, a polyacrylic acid salt, a polymethacrylic acid, a polymethacrylic acid salt, a polyolefin (which includes copolymers thereof, for example poly(ethylene-propylene), a poly(alkylene-co-acrylic acid), a poly(alkylene-co-acrylic acid salt), a poly(alkylene-co-methacrylic acid), a poly(alkylene-co-methacrylic acid salt), a polyamide, a polyimide, a polyisocyanate, a polythiol, a polyester, a polyamideimide, a polyetherimide, a polyacrylonitrile, apolyarylene ether, a polyarylene sulfide, a polyarylene sulfone, a polybenzoxazole, polybenzothiazole, a polybutadiene (which includes copolymers thereof), a polycarbonate, a polycarbonate ester, a polyether ketone, a polyether ether ketone, a polyether ketone ketone, a polyethersulfone, a polyisoprene, a polyphosphazene, a polystyrene (which includes copolymers thereof), a rubber-modified polystyrene (for example, acrylonitrile-butadiene-styrene (ABS), styrene-ethylene-butadiene (SEB), or methyl methacrylate-butadiene-styrene (MBS)), a polyoxadiazole, a polysilazane, polysulfone, a polysulfonamide, a polyvinyl acetate, a polyvinyl chloride, a polyvinyl ester, a polyvinyl ether, a polyvinyl halide, a polyvinyl nitrile, a polyvinyl thioether, a polyurea, a polyurethane, an epoxy, an ethylene propylene diene rubber, ethylene propylene diene monomer rubber, a melamine, a silicone, or a combination thereof. The polymer may be linear, branched, graft, or star-shaped.

The polyolefin may be selected from polyethylene, polypropylene, or a copolymer thereof. The alkylene in the copolymers may be a C1 to C20 alkylene, for example ethylene or propylene . . . .

The poly(alkylene-co-acrylic acid), poly(alkylene-co-acrylic acid salt), poly(alkylene-co-methacrylic acid), and poly(alkylene-co-methacrylic acid salt) may be a block copolymer including an alkylene structural unit (e.g., ethylene or propylene) and a structural unit derived from (meth)acrylic acid or a salt thereof which are arranged as a block, or a random copolymer including an alkylene structural unit and a structural unit derived from (meth)acrylic acid or a salt thereof which are randomly arranged. According to an embodiment, in the block copolymer or random copolymer, a structural unit derived from acrylic acid, methacrylic acid, or a salt thereof may be included in an amount of about 1 mole percent (mol %) to about 100 mol %, specifically, about 2 mol % to about 50 mol %, and more specifically, about 4 mol % to about 20 mol %, based on the total amount of the copolymer. Within the above ranges, the semiconductor nanocrystal may be stably passivated.

The polyacrylic acid salt, polymethacrylic acid salt, poly(alkylene-co-acrylic acid salt), and poly(alkylene-co-methacrylic acid salt) may include a monovalent metal capable of having an ionic bond with the carboxyl group (—C(=O)OH) thereof, or more than a divalent metal capable of having an ionic bond or a coordination bond with the carboxyl group (—C(=O)OH) thereof. Examples of the monovalent metal may include Na, K, and the like. Examples of the more than divalent metal may include Mg, Ca, Sc, Ti, V, Cr, Mn, Fe, Co, Ni, Cu, Zn, Ga, Rb, Sr, Y, Zr, Nb, Mo, Cd, In, Ba, Au, Hg, Tl, and the like.

The polymer 14 may have a Shore D hardness of greater than or equal to about 20 and less than or equal to about 90 measured according to ASTM D2240-05, (a Standard Test Method for Rubber Property-Durometer Hardness), and specifically, greater than or equal to about 25 and less than or equal to about 70, more specifically greater than or equal to about 30 and less than or equal to about 60. When the polymer 14 has a hardness within the foregoing range, the semiconductor nanocrystal-polymer reaction product may be cryogenic-milled to provide the semiconductor nanocrystal-polymer micronized composite 10. When the polymer 14 has a lower temperature than a glass transition temperature ("Tg"), the polymer 14 may be a solid capable of being easily ground or milled. Since the cryogenic temperature is generally lower than the glass transition temperature ("Tg") of the polymer 14, the polymer may be easily ground or milled. Accordingly, the polymer 14 has no particular limit except for a glass transition temperature ("Tg") of less than or equal to about 100° C., specifically, a glass transition temperature ("Tg") of about −150° C. to about 95° C., and more specifically, a glass transition temperature ("Tg") of about −125° C. to about 90° C. When the polymer has a glass transition temperature within the foregoing range, the polymer may be easily ground or milled using a cryogenic milling process.

The semiconductor nanocrystal-polymer micronized composite 10 may include about 1 weight percent to about 50 weight percent ("wt %"), of the at least one semiconductor nanocrystals, based on the total weight of the semiconductor nanocrystal-polymer micronized composite. While not wishing to be bound by theory, it is believed when the semiconductor nanocrystal-polymer micronized composite includes the semiconductor nanocrystal within the foregoing range, a polymer effectively surrounds and protects the semiconductor nanocrystal, and thus increases stability of the semiconductor nanocrystal.

Figure 2:
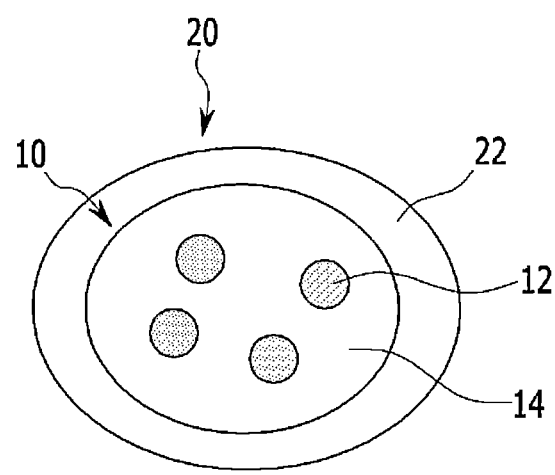
FIG. 2 is a schematic view showing a semiconductor nanocrystal-polymer micronized composite according to another embodiment as disclosed herein.

As shown in FIG. 2, an encapsulated semiconductor nanocrystal-polymer micronized composite 20 according to another embodiment may further include an encapsulation polymer 22 surrounding at least one of the semiconductor nanocrystal-polymer micronized composite 10.

Figure 3:
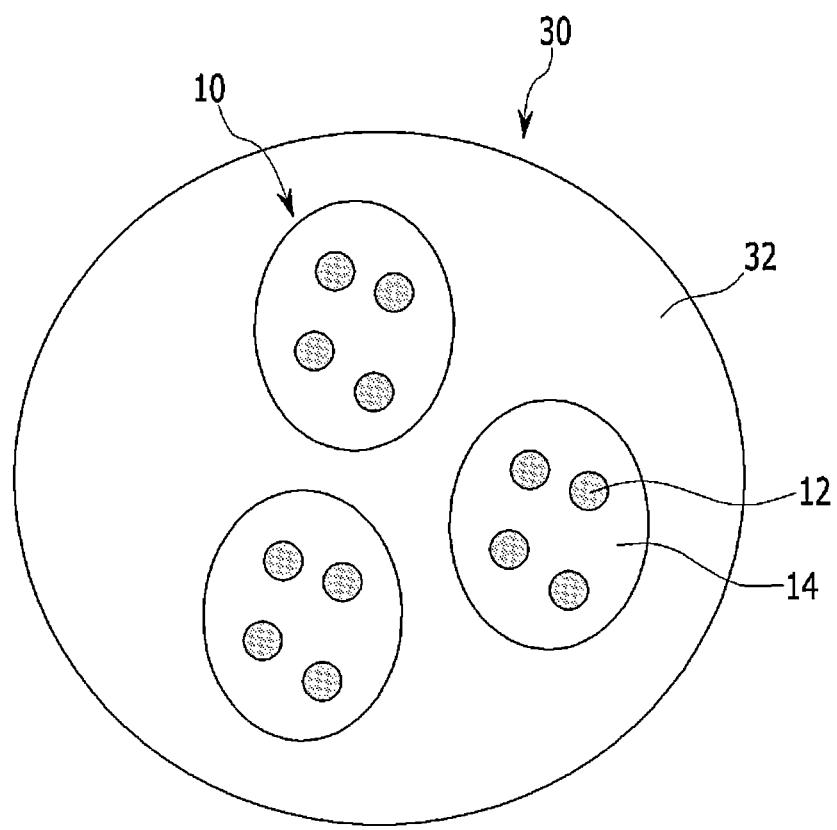
FIG. 3 is a schematic view showing a semiconductor nanocrystal-polymer micronized composite according to yet another embodiment as disclosed herein.

As shown in FIG. 3, the an encapsulated semiconductor nanocrystal-polymer micronized composite 30 according to yet another embodiment further includes an encapsulation polymer 32 surrounding a plurality of semiconductor nanocrystal-polymer micronized composites 10.

The encapsulation polymers 22 and 32 may be selected from a wide variety of polymers as described above, based in the desired properties of the encapsulation polymers, cost, ease of processing, and the like. For example, the encapsulation polymer may be a silicone resin; an epoxy resin; a poly (meth)acrylate polymer; an organic/inorganic hybrid polymer; a polycarbonate; a polystyrene; a polyolefin, such as polyethylene, polypropylene, polyisobutylene, and the like; a polymerized product of a first monomer including at least two thiol (—SH) groups, and a second monomer including at least two carbon-carbon unsaturated bond-containing groups, and a combination thereof.

The poly(meth)acrylate polymer may include a poly(methyl methacrylate) ("PMMA"), a poly(lauryl methacrylate) ("PLMA"), and the like.

The organic/inorganic hybrid polymer may include a first moiety including a siloxane bond (—Si—O—Si—), a second moiety including a siloxane bond and at least one organic functional group, and a third moiety including a siloxane bond and a cross-linked residue of at least one reactive functional group.

The organic/inorganic hybrid polymer may further include a fourth moiety including a —O-M-O— bond, wherein M is selected from Al, Sn, Ti, Zr, Ge, B, and a combination thereof.

The organic/inorganic hybrid polymer may be a condensation polymerization polymer of a first alkoxy silane represented by the following Chemical Formula 1, a second alkoxy silane represented by the following Chemical Formula 2, and a third alkoxysilane represented by and the following Chemical Formula 3.

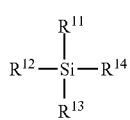

Chemical Formula 1

In Chemical Formula 1, $R^{11}$ to $R^{14}$ are each independently a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group.

The alkoxy silane of the above Chemical Formula 1 may include tetramethoxysilane, tetraethoxysilane, tetrabutoxysilane, and the like.

Chemical Formula 2

In Chemical Formula 2, $R^{21}$ is a substituted or unsubstituted C6 to C20 aryl group, a substituted or unsubstituted C1 to C20 linear or branched alkyl group, for example, a fluoroalkyl group, a substituted or unsubstituted C1 to C20 aminoalkyl group, a substituted or unsubstituted C2 to C20 alkynyl group, a substituted or unsubstituted C2 to C20 alkenyl group, a substituted or unsubstituted C1 to C20 amine group, —C(=O)OR' (wherein R' is a C1 to C20 linear or branched alkyl group), or —C(=O)ONRR' (wherein R and R' are independently a C1 to C20 linear or branched alkyl group), $R^{22}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, a substituted or unsubstituted C2 to C10 carbonylalkoxy group, and p is an integer ranging from 1 to 3.

The alkoxy silane of the above Chemical Formula 4 may include methyltrimethoxysilane, ethyltrimethoxysilane, propyltrimethoxysilane, butyltrimethoxysilane, pentyltrimethoxysilane, hexyltrimethoxysilane, methyltriethoxysilane, ethyltriethoxysilane, propyltriethoxysilane, butyltriethoxysilane, pentyltriethoxysilane, hexyltriethoxysilane, dimethyldimethoxysilane, diethyldimethoxysilane, dipropyldimethoxysilane, dibutyldimethoxysilane, dipentyldimethoxysilane, dihexyldimethoxysilane, dimethyldiethoxysilane, diethyl diethoxysilane, dipropyldiethoxysilane, dibutyldiethoxysilane, dipentyldiethoxysilane, dihexyldiethoxysilane, aminomethyltrimethoxysilane, aminoethyltrimethoxysilane, aminopropyltrimethoxysilane, aminobutyltrimethoxysilane, aminopentyltrimethoxysilane, aminohexyltrimethoxysilane, aminomethyltriethoxysilane, aminoethyltriethoxysilane, aminopropyltriethoxysilane, aminobutyltriethoxysilane, aminopentyltriethoxysilane, aminohexyltriethoxysilane, phenyltrimethoxysilane, diphenyldimethoxysilane, phenyltriethoxysilane, diphenyldiethoxysilane, and the like.

Chemical Formula 3

In Chemical Formula 3, $R^{31}$ is a reactive photo-cross-linking or a thermal cross-linking functional group, for example a (meth)acryloxy group; an epoxy group, for example, a glycidyloxy group; a spiroorthoester group; a substituted or unsubstituted C2 to C30 alkenyl group; a substituted or unsubstituted C2 to C30 alkynyl group; a substituted or unsubstituted C3 to C30 alicyclic organic group including a double bond or a triple bond in a ring; a substituted or unsubstituted C3 to C30 heterocycloalkyl group including a double bond or a triple bond in a ring; a C3 to C30 alicyclic organic group substituted with a C2 to C30 alkenyl group or a C2 to C30 alkynyl group; or a C3 to C30 heterocycloalkyl group substituted with a C2 to C30 alkenyl group or a C2 to C30 alkynyl group, $R^{32}$ is a hydroxy group, a halogen, a substituted or unsubstituted C1 to C8 linear or branched alkoxy group, a substituted or unsubstituted C6 to C12 aryloxy group, a substituted or unsubstituted C2 to C10 carbonylalkyl group, or a substituted or unsubstituted C2 to C10 carbonylalkoxy group, and q is an integer ranging from 1 to 3.

The organic/inorganic hybrid polymer may be a condensation polymerization polymer of the alkoxy silane compounds represented by the above Chemical Formulas 1 to 3 and an alkoxide compound represented by the following Chemical Formula 4.

$$M(R)_r \quad \text{Chemical Formula 4}$$

In Chemical Formula 4,

R is a hydroxy group, a halogen, a substituted or unsubstituted C1 to C8 linear or branched alkoxy group, for example, a methoxy, ethoxy, isopropoxy, or t-butoxy, a substituted or unsubstituted C6 to C12 aryloxy group, a substituted or unsubstituted C2 to C10 carbonylalkyl group, or a substituted or unsubstituted C2 to C10 carbonylalkoxy group, M is selected from Al, Si, Sn, Ti, Zr, Ge, B, and a combination thereof, and r is determined depending on a bonding valence of M.

The first to third moieties may be derived from the above Chemical Formulas 1 to 3, respectively. The first alkoxy silane represented by Chemical Formula 1 undergoes condensation polymerization to provide a first moiety including a siloxane bond (—Si—O—Si—), the second alkoxy silane represented by Chemical Formula 2 undergoes condensation polymerization to provide a second moiety including a siloxane bond and at least one organic functional group, and the third alkoxy silane represented by Chemical Formula 3 undergoes condensation polymerization to provide a third moiety including a siloxane bond and a cross-linked residue of at least one reactive functional group. Therefore, the organic functional group of the second moiety may be $R^{21}$ of Chemical Formula 2, and the cross-linked organic functional group of the third moiety is provided by cross-linking $R^{31}$, a reactive photo-cross-linking or a thermal cross-linking functional group of Chemical Formula 3.

The second moiety may increase flexibility and refractive index of a condensation polymerization polymer.

The first alkoxy silane, the second alkoxy silane, and the third alkoxide compound may each be used in an amount of about 0.5 weight percent ("wt %") to about 55 wt %, about 35 wt % to about 99 wt %, and about 0.01 wt % to about 10 wt %. The first alkoxy silane may be used at an amount of about 10 wt % to about 55 wt %, specifically about 25 wt % to about 55 wt %, and more specifically about 50 wt % to about 55 wt %. When the first alkoxy silane, second alkoxy silane, and third alkoxy silane undergo a condensation polymerization within the above range, a polymer film having an excellent refractive index, as well as photo-stability and thermal stability, may result.

The polymerized product of a first monomer including at least two thiol (—SH) groups and a second monomer including at least two carbon-carbon unsaturated bond-containing groups may be a polymerized product of a first monomer of Chemical Formula 5 and a second monomer of Chemical Formula 6-1 or 6-2.

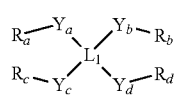

Chemical Formula 5

In Chemical Formula 5, $L_1$ is a substituted or unsubstituted C1 to C30 alkylene group, a substituted or unsubstituted C6 to C30 arylene group, for example, a substituted or unsubstituted phenylene group; a substituted or unsubstituted C6 to C30 heteroarylene group; a substituted or unsubstituted C3 to C30 cycloalkylene group; or a substituted or unsubstituted C3 to C30 heterocycloalkylene group, $Y_a$ to $Y_d$ are each independently a substituted or unsubstituted C1 to C30 alkylene group; a substituted or unsubstituted C2 to C30 alkenylene group; or a C1 to C30 alkylene group or a C2 to C30 alkenylene group, wherein at least one methylene group is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a linear or branched C1 to C10 alkyl group), or —NR— wherein R is hydrogen or a linear or branched C1 to C10 alkyl group, and $R_a$ to $R_d$ are each independently hydrogen; a thiol group (—SH); a substituted or unsubstituted C1 to C30 alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C2 to C30 alkenyl group; a C2 to C30 alkynyl group; a substituted or unsubstituted C3 to C30 alicyclic organic group including a double bond or a triple bond in a ring; a substituted or unsubstituted C3 to C30 heterocycloalkyl group including a double bond or a triple bond in a ring; a C3 to C30 alicyclic organic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; —NH$_2$; a substituted or unsubstituted C1 to C30 amine group —NRR', wherein R and R' are each independently hydrogen or a C1 to C20 alkyl group; an isocyanurate group; a (meth)acrylate group; a halogen; —ROR' (wherein R is a substituted or unsubstituted C1 to C20 alkylene group, and R' is hydrogen or a C1 to C20 alkyl group); —C(=O)OR' (wherein R' is hydrogen or a C1 to C20 alkyl group); —CN; or —C(=O)ONRR' (wherein R and R' are each independently hydrogen or a C1 to C20 alkyl group), provided at least two of $R_a$ to $R_d$ are a thiol group (—SH).

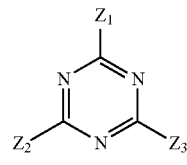

Chemical Formula 6-1

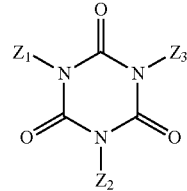

Chemical Formula 6-2

In Chemical Formulas 6-1 and 6-2, $Z_1$ to $Z_3$ are each independently —Y$_2$—(X)$_n$, wherein $Y_2$ is a single bond; a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced with a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a linear or branched C1 to C10 alkyl group, —NR— wherein R is hydrogen or a linear or branched C1 to C10 alkyl group, and a combination thereof, X is a C2 to C30 aliphatic organic group including a carbon-carbon double bond or a carbon-carbon triple bond, a C6 to C30 aromatic organic group including a carbon-carbon double bond or a carbon-carbon triple bond, or a C3 to C30 alicyclic organic group including a carbon-carbon double bond or a carbon-carbon triple bond, and n is an integer of 1 or more, for example, an integer ranging from 1 to 4, provided that n does not exceed the valence of $Y_2$.

Referring to FIG. 2 and FIG. 3, the encapsulation polymers 22 and 32 may be used in an amount of about 200 to about 5000 parts by weight, and specifically, about 300 to about 2000 parts by weight, more specifically, about 350 to about 1250 parts by weight, based on 100 parts by weight of the semiconductor nanocrystal-polymer micronized composite 10. According to an embodiment, when the encapsulation polymers are used within the foregoing range, the passivation effects of a semiconductor nanocrystal may be increased, and the efficiency of a semiconductor nanocrystal may not be decreased.

The encapsulation polymers 22 and 32 improve compatibility and miscibility of semiconductor nanocrystal-polymer micronized composites 20 and 30 with the matrix of a light emitting device described later, and thus promote, the uniform dispersion of the semiconductor nanocrystal-polymer micronized composites 20 and 30 in the matrix of the light emitting device.

The encapsulation polymers 22 and 32 may include an organic/inorganic hybrid polymer.

Figure 4:
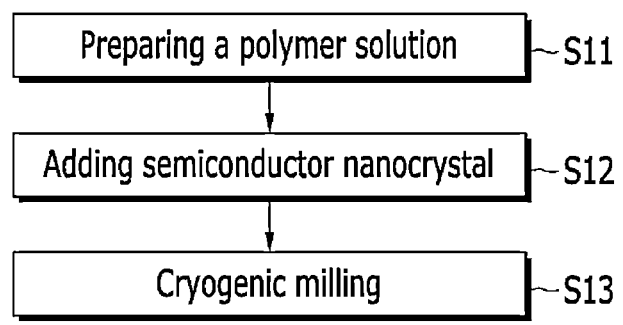
FIG. 4 shows a method of preparing a semiconductor nanocrystal-polymer micronized composite according to an embodiment as disclosed herein.

Referring to FIG. 4, a method of preparing a semiconductor nanocrystal-polymer micronized composite is illustrated, according to an embodiment.

First a polymer for passivating a semiconductor nanocrystal is dissolved or dispersed in a solvent, to provide a polymer solution (S11). The polymer includes at least one functional group that is capable of reacting with the semiconductor nanocrystal, i.e., is reactive with the semiconductor nanocrystal. The at least one functional group may be located at a terminal end or on the main chain of the polymer, and is the same as described above. The solvent may include an aromatic hydrocarbon solvent. Examples of the aromatic hydrocarbon solvent may include toluene, xylene, and the like.

Next, a semiconductor nanocrystal is added to the polymer solution and the semiconductor nanocrystal is reacted with the polymer to form a reaction product (S12). According to an embodiment, a metal precursor may be added to the mixture to help the semiconductor nanocrystal combine with the polymer, for example to aid in dispersion of the semiconductor nanocrystal and or reaction with the polymer. The reaction product is filtered and dried. The dried reaction product is cryogenic milled, to provide the semiconductor nanocrystal-polymer micronized composite (S13), wherein the semiconductor nanocrystal-polymer micronized composite has a particle diameter of less than or equal to about 70 micrometers (μm) with a standard deviation of less than or equal to about 20 micrometers (μm), and an aspect ratio of greater than about 1.0 and less than or equal to about 10. The semiconductor nanocrystal, polymer, and functional group may be the same as described above. The cryogenic milling may be performed at a lower temperature than the glass transition temperature of the polymer. The cryogenic milling may be performed at a temperature of about 10 kelvin (K) to about 273 K, specifically, about 10 K to 150 K, and more specifically about 10 K to about 125 K. When the cryogenic milling is performed within the foregoing temperature range, a semiconductor nanocrystal-polymer micronized composite may have a desired particle diameter and dispersity.

The cryogenic milling may be performed by using any cryogenic milling apparatus, for example a ball mill, an attrition mill, a bead mill, a three-roll mill, and the like. The mill for the cryogenic milling may include at least one ball or bead selected from alumina, zirconia, yittria-stabilized zirconia ("YSZ"), titania, steel, tungsten carbide, or a combination thereof. The cryogenic milling may be conducted as a batch-type process or a continuous-type process.

Then, a temperature of the semiconductor nanocrystal-polymer micronized composite obtained from the cryogenic milling is raised, from the cryogenic milling temperature to room temperature (for example about 23 degrees Celsius ("° C.") to about 25° C. and further sieved through a sieve. The temperature raising may be performed under an inert atmosphere. The inert atmosphere may include a nitrogen atmosphere. For example, a nitrogen ($N_2$) glove box blocking external moisture from flowing in, or a desiccator filled with nitrogen ($N_2$), may be used. In addition, a vessel including the resulting material may be dipped in water at a predetermined temperature in order to raise a temperature of the semiconductor nanocrystal-polymer micronized composite obtained from the cryogenic milling. Other methods of removing the larger particles may be used, for example classification. Further, the temperature may be raised to an intermediate value (e.g., about 0 to about 10° C.) or a higher value (e.g., about 25° C. to about 50° C. C) if desired for processing reasons (e.g., to improve stability of the semiconductor nanocrystal-polymer micronized composite).

The sieve may have a mesh size of less than or equal to about 50 micrometers (μm), specifically, a mesh size of about 10 μm to about 45 μm, and more specifically about 20 μm to about 45 μm. When the reactant material is sieved, a semiconductor nanocrystal-polymer micronized composite may have improved uniformity and dispersion.

In addition, the method may further include a secondary (i.e., additional) cryogenic milling process after the semiconductor nanocrystal-polymer micronized composite is obtained. Such additional cryogenic milling can be conducted at any time after the semiconductor nanocrystal-polymer micronized composite is obtained, for example before or after sieving. According to an embodiment, a semiconductor nanocrystal-polymer micronized composite obtained through the cryogenic milling is added to an encapsulation polymer. The mixture may be used directly, or micronized. For example secondary (additional) cryogenic milling is performed on the mixture of the semiconductor nanocrystal-polymer micronized composite obtained from the prior cryogenic milling and the encapsulation polymer, to provide an encapsulated semiconductor nanocrystal-polymer micronized composite illustrated in FIG. 2 or 3. The encapsulation polymer is the same as described in FIGS. 2 and 3.

Another embodiment provides a device including the semiconductor nanocrystal-polymer micronized composite, for example an optoelectronic device including the semiconductor nanocrystal-polymer micronized composite. The optoelectronic device may include a light emitting device such as a light emitting diode ("LED") device or an organic light emitting diode ("OLED"), a memory device, a laser device, or a solar cell.

Figure 5:
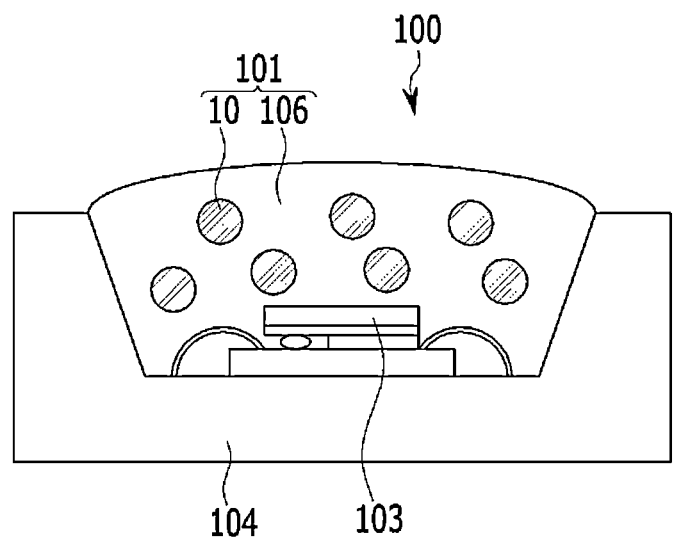
FIGS. 5 to 9 are cross-sectional views showing light emitting devices according to various embodiments as disclosed herein.

Referring to FIG. 5, a light emitting device according to an embodiment is described.

FIG. 5 is a cross-sectional view showing the light emitting device 100 according to an embodiment. Referring to FIG. 5, the light emitting device 100 includes a substrate 104, including Ag or the like, a light source 103, for example a light emitting diode chip emitting light in a blue or ultraviolet ("UV") region, for example, disposed on the substrate 104, and a light conversion layer 101 including a semiconductor nanocrystal-polymer micronized composite 10 and a matrix 106 on the light source 103. The light emitting device may use a light source 103 such as a laser, a lamp, or the like instead of a light source such as the light emitting diode chip.

The matrix 106 may include any of the polymers described above, for example a silicone resin; an epoxy resin; a (meth)acrylate-containing resin; an organic/inorganic hybrid polymer; a polycarbonate; a polystyrene; a polyolefin such as polyethylene, polypropylene, polyisobutylene, and the like; a polymerized product of a first monomer including at least two thiol (—SH) groups, and a second monomer including at least two carbon-carbon unsaturated bond-containing groups; a silica; a metal oxide; or a combination thereof.

According to an embodiment, the polymerized product of a first monomer including at least two thiol (—SH) groups, and a second monomer including at least two carbon-carbon unsaturated bond-containing groups, are the same as the encapsulation polymers 22 and 32 described in FIGS. 2 and 3.

The metal oxide may be alumina, titania, zirconia, and the like, or a combination thereof.

Figure 6:
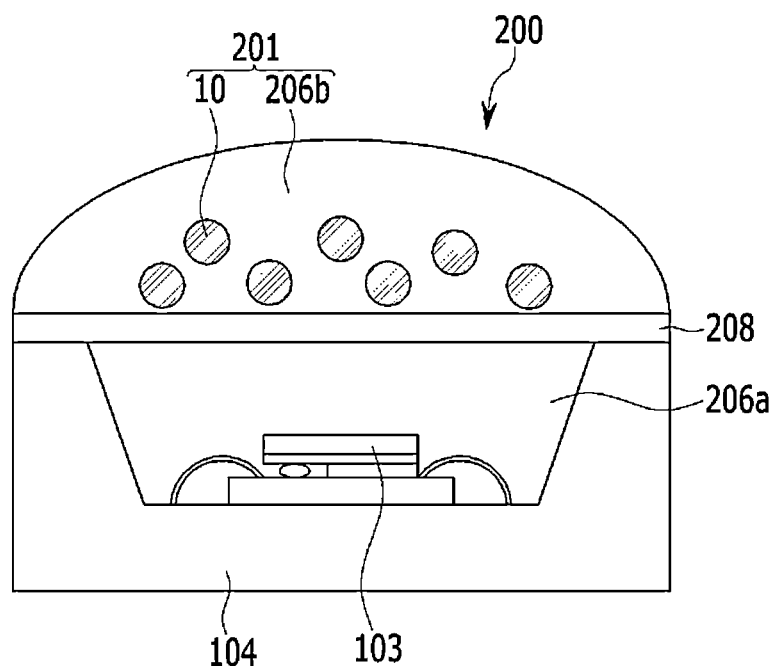

As shown in FIG. 6, a light emitting device 200 includes a light source 103; a first matrix 206a disposed on the light source 103; a transparent plate 208 disposed on (e.g., covering) the first matrix 206a opposite the light source; and a light converting layer 201 disposed on the transparent plate 208 opposite the first matrix layer, wherein the light converting layer includes a second matrix 206b and the semiconductor nanocrystal-polymer micronized composite 10 and the second matrix 206b. The transparent plate 208 may be made of glass or a transparent polymer. While not wishing to be bound by theory, it is believed the transparent plate 208 prevents the semiconductor nanocrystal polymer micronized composite 10 from being degraded by a light emitting diode chip when such chip is used as a light source.

The first matrix 206a and the second matrix 206b may be the same or different, and may be any of the polymers described above. For example, the first matrix 206a and the second matrix 206b are the same and are selected from a silicone resin; an epoxy resin; a (meth)acrylate-containing resin; an organic/inorganic hybrid polymer; a polycarbonate; a polystyrene; a polyolefin such as polyethylene, polypropylene, polyisobutylene, and the like; a polymerized product of a first monomer including at least two thiol (—SH) groups, and a second monomer including at least two carbon-carbon unsaturated bond-containing groups; a silica; a metal oxide; and a combination thereof. In an embodiment, the first matrix 206a and the second matrix 206b are each a silicone resin.

According to an embodiment, the polymerized product of a first monomer including at least two thiol (—SH) groups, and a second monomer including at least two carbon-carbon unsaturated bond-containing groups are the same as the encapsulation polymers 22 and 32 described in FIGS. 2 and 3.

The metal oxide may include alumina, titania, zirconia, and the like.

The first matrix 206a and the second matrix 206b may be the same or different from each other. The first matrix 206a may be a silicone resin having excellent transparency and refractive index characteristics, and high thermal stability.

Figure 7:
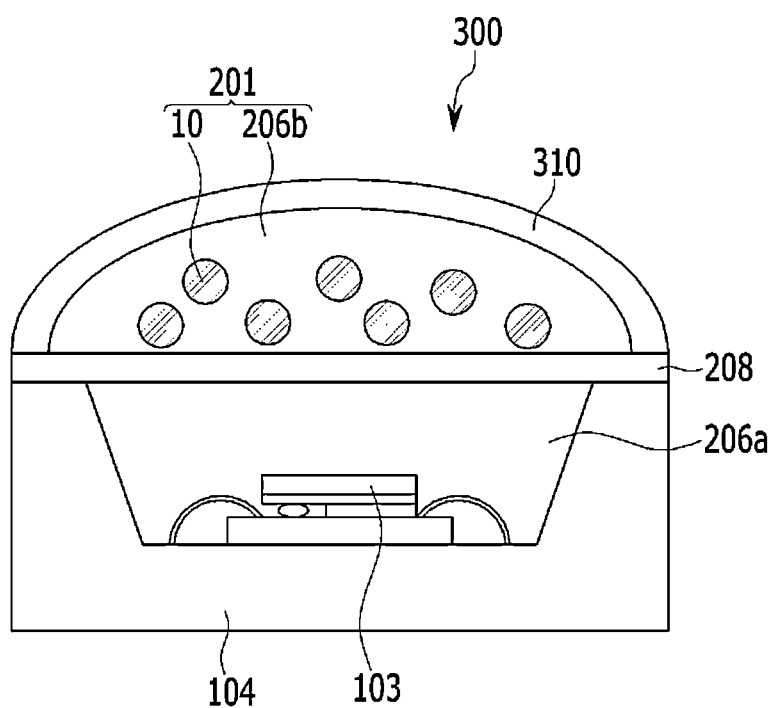

As shown in FIG. 7, the light emitting device 300 may further include an outer polymer film 310 on the light emitting device 200 illustrated in FIG. 6. In particular, the outer polymer film 310 is disposed on the light converting layer 201 opposite the transparent plate 208. The light converting layer 201 includes a second matrix 206b and the semiconductor nanocrystal-polymer micronized composite 10. The materials and thickness of polymer film 310 are selected to efficiently protect the semiconductor nanocrystal from oxygen or moisture, and stably maintains optical properties of the light emitting device 300. In an embodiment the outer polymer film 310 includes a polymerized product of a first monomer including at least two thiol (—SH) groups, and a second monomer including at least two carbon-carbon unsaturated bond-containing groups, and the first monomer and the second monomer are the same as the encapsulation polymers 22 and 32 described in FIGS. 2 and 3.

Figure 8:
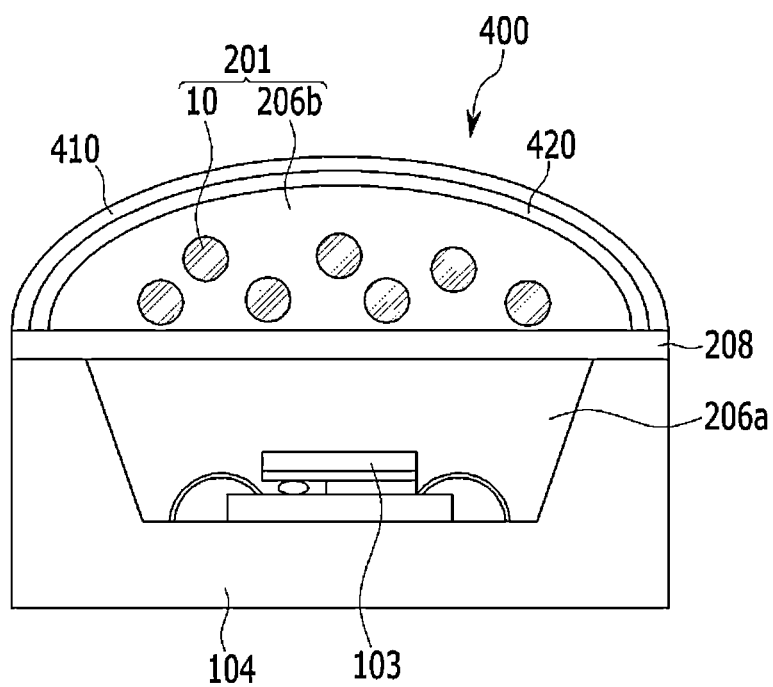

As shown in FIG. 8, the light emitting device 400 may further include a second, inner polymer film 420 between a first, outer polymer film 410 and a matrix 206b. The outer polymer film 410 may be a protective film and may include a polymerized product of a first monomer including at least two thiol (—SH) groups, and a second monomer including at least two carbon-carbon unsaturated bond-containing groups, wherein the first monomer and the second monomer are the same as the encapsulation polymers 22 and 32 described in FIGS. 2 and 3. The second, inner polymer film 420 may include an organic/inorganic hybrid polymer, or a polymerized product of a first monomer including at least two thiol (—SH) groups and a siloxane-based second monomer or oligomer including at least one carbon-carbon unsaturated bond.

The organic/inorganic hybrid polymer is the same as described above for the encapsulation polymer.

The first monomer including at least two thiol (—SH) groups of the inner polymer film is the same as the first monomer of the encapsulation polymer described above, and the siloxane-containing second monomer or oligomer including at least one carbon-carbon unsaturated bond is represented by the following Chemical Formula 7.

Chemical Formula 7

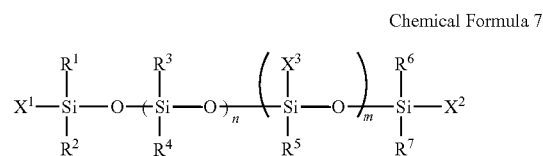

In Chemical Formula 7, $X^1$ to $X^3$ are each independently a hydrogen, a C1 to C10 alkyl group, a C2 to C30 aliphatic organic group including a carbon-carbon unsaturated bond, a C6 to C30 aromatic organic group including a carbon-carbon unsaturated bond-containing substituent, or a C3 to C30 alicyclic organic group including a carbon-carbon unsaturated bond, provided that at least one of $X^1$ to $X^3$ is not hydrogen, $R^1$ to $R^7$ are each independently a halogen; a substituted or unsubstituted C1 to C30 alkyl group; a substituted or unsubstituted C6 to C30 aryl group; a substituted or unsubstituted C6 to C30 heteroaryl group; a substituted or unsubstituted C3 to C30 cycloalkyl group; a substituted or unsubstituted C3 to C30 heterocycloalkyl group; a substituted or unsubstituted C2 to C30 alkenyl group; a substituted or unsubstituted C2 to C30 alkynyl group; a substituted or unsubstituted C3 to C30 alicyclic organic group including a double bond or a triple bond in a ring; a substituted or unsubstituted C3 to C30 heterocycloalkyl group including a double bond or a triple bond in a ring; a C3 to C30 alicyclic organic group substituted with a C2 to C30 alkenyl group or a C2 to C30 alkynyl group; a C3 to C30 heterocycloalkyl group substituted with a C2 to C30 alkenyl group or a C2 to C30 alkynyl group; a hydroxy group; —NH$_2$; a substituted or unsubstituted C1 to C30 amine group; an isocyanate group; an isocyanurate group; a (meth)acryloyloxy group; an alkyleneoxy group (—ROR', wherein R is a substituted or unsubstituted C1 to C20 alkylene group, and R' is hydrogen or a C1 to C20 alkyl group); an acyl halide group (—RC(=O)X, wherein R is a substituted or unsubstituted C1 to C20 alkylene group, and X is a halogen); —C(=O)OR' (wherein R' is hydrogen or a C1 to C20 alkyl group); —CN; or —C(=O)ONRR' (wherein R and R' are each independently hydrogen or a C1 to C20 alkyl group), and n and m are each independently integers ranging from 0 to 300.

In an embodiment the first, outer polymer film 410 may be selected to efficiently protect a semiconductor nanocrystal from oxygen or moisture and stably maintain optical properties of a device. The second, inner polymer film 420 may be selected to improve the affinity between the first, outer polymer film 410 and the matrix 206b, and thus an interface adherence therebetween may be improved.

Figure 9:
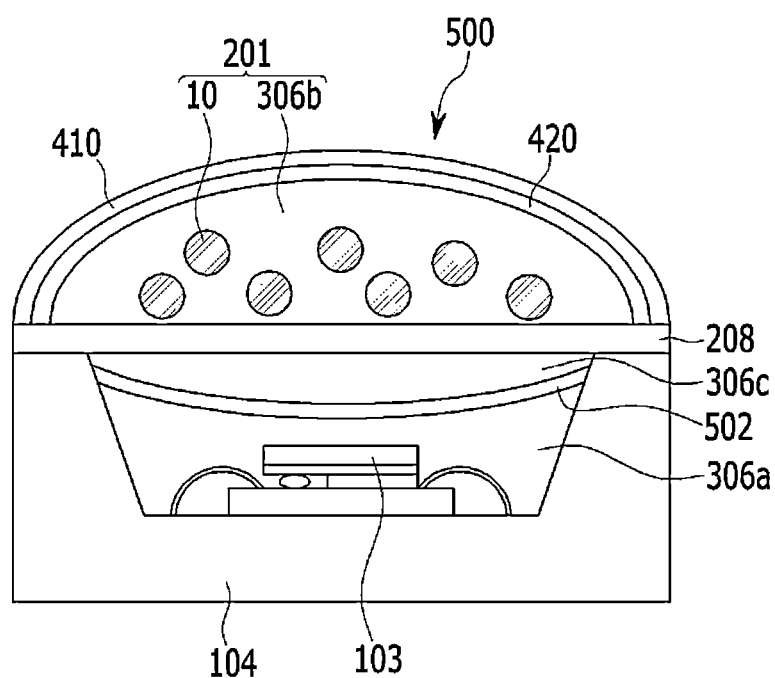

The light emitting device 500 illustrated in FIG. 9 includes a light source 103 disposed on the substrate 104; a first matrix 306a disposed on the light source 103; a polymer layer 502 including an organic/inorganic hybrid polymer disposed on the first matrix 306a opposite the light source; a second matrix 306c disposed on the polymer layer 502 opposite the first matrix; a transparent plate 208 disposed on (e.g., covering) the second matrix 306c opposite the polymer layer 502; a light converting layer 201 disposed on the transparent plate 208 opposite the second matrix 306c, wherein the light converting layer includes a third matrix 306b and the semiconductor nanocrystal-polymer micronized composite 10 dispersed in the third matrix 306b; and an inner polymer film 420 and an outer polymer film 410.

In the light emitting device 500 illustrated in FIG. 9, the first matrix 306a, the second matrix 306c, and the third matrix 306b may be the same or different, and may be any of the polymers disclosed above, and specifically may include a silicone resin; an epoxy resin; a (meth)acrylate-containing resin; an organic/inorganic hybrid polymer; a polycarbonate; polystyrene; a polyolefin such as polyethylene, polypropylene, polyisobutylene, and the like; a polymerized product of a first monomer including at least two thiol (—SH) groups, and a second monomer including at least two carbon-carbon unsaturated bond-containing groups; a polymerized product of a first monomer including at least two thiol (—SH) groups and a siloxane-based second monomer or oligomer including at least including at least one carbon-carbon unsaturated bond; silica; a metal oxide; or a combination thereof, and in an embodiment, a silicone resin is desired, particularly for the first matrix layer 306a.

According to an embodiment, the polymerized product of a first monomer including at least two thiol (—SH) groups, and a second monomer including at least two carbon-carbon unsaturated bond-containing groups are the same as the encapsulation polymers 22 and 32 described in FIGS. 2 and 3.

The metal oxide may include alumina, titania, zirconia, and the like.

The first matrix layer 306a, the second matrix 306c, and the third matrix 306b may be the same or different from each other. The first matrix 306a, the second matrix 306c, and the third matrix 306b may each be a silicone resin having excellent transparency and refractive index characteristics, and high thermal stability. The outer polymer film 410 may be a protective film and may include a polymerized product of a first monomer including at least two thiol (—SH) groups, and a second monomer including at least two carbon-carbon unsaturated bond-containing groups, wherein the first monomer and the second monomer are the same as the encapsulation polymers 22 and 32 described in FIGS. 2 and 3. The inner polymer film 420 may include an organic/inorganic hybrid polymer, or a polymerized product of a first monomer including at least two thiol (—SH) groups and a siloxane-based second monomer or oligomer including at least one carbon-carbon unsaturated bond. The polymer layer 502 may be an organic/inorganic hybrid polymer.

According to an embodiment, the organic/inorganic hybrid polymer is the same as described in the encapsulation polymer, and a polymer layer 502 including the organic/inorganic hybrid polymer may be interposed between the semiconductor nanocrystal-polymer micronized composite 10 and light source 103 in FIGS. 5 to 7.

The semiconductor nanocrystal-polymer micronized composite 10 absorbs light-emitting energy of the light emitting diode chip 103 and emits excited energy as a light with a different wavelength. The semiconductor nanocrystal-polymer micronized composite 10 may have variously-regulated light emitting wavelengths. For example, a white light emitting diode may be fabricated by combining a red light emitting micronized composite and a green light emitting micronized composite with a blue light emitting diode chip. Alternatively, a white light emitting diode may be fabricated by combining red, green, and blue light emitting micronized composites with an ultraviolet ("UV") light emitting diode chip. A light emitting diode, emitting light with various wavelengths may be fabricated by combining nanocrystals emitting light with various wavelengths with a light emitting diode chip.

Hereinafter, the embodiments are illustrated in more detail with reference to examples. However, the following are exemplary embodiments and are not limiting of the claims.

Preparation Example 1

Synthesis of Green Semiconductor Nanocrystal 16 grams (g) of trioctylamine ("TOA"), 0.3 g of octadecylphosphonic acid, and 0.4 millimoles (mmol) of cadmium oxide are simultaneously introduced into a 125 milliliter (mL) flask mounted with a reflux condenser. The mixture is heated to 120° C. while being agitated and under vacuum. When the temperature reaches 120° C., nitrogen is flowed therein and the reaction temperature is increased to 300° C.

Separately, selenium (Se) powder is dissolved in trioctylphosphine ("TOP"), to provide a Se-TOP complex solution having a Se concentration of about 2 Molar (M). Then, 2 mL of the 2M Se-TOP complex solution is rapidly injected into the reaction mixture that is agitated at about 300° C. and reacted for 2 minutes.

After completing the reaction, the temperature of the reaction mixture is cooled as rapidly as possible to room temperature (about 23° C. to about 25° C.), and ethanol as a non-solvent is added thereto. Then, the mixture is centrifuged. The supernatant of the solution excluding the centrifuged precipitate is discarded, and the precipitate is dispersed in toluene to synthesize a cadmium-selenium (CdSe) nanocrystal solution emitting a light at 485 nm.

Separately 8 g of TOA, 0.1 g of oleic acid, and 0.4 mmol of zinc acetate ((Zn(Et)$_2$) are simultaneously introduced into a 125 ml flask mounted with a reflux condenser, and the reaction temperature is controlled to about 300° C. while agitating the mixture. Then, 1 wt % of the synthesized CdSe nanocrystal solution is added into the reactant, and 2 mL of 0.4 M S-TOP complex solution is slowly added thereto and reacted for about 1 hour to grow zinc-sulfide (ZnS) nanocrystals on the surface of the CdSe nanocrystals and to provide a CdSe//ZnS alloy nanocrystal through diffusion at the interface.

After completing the reaction, the temperature of the reaction mixture is cooled to room temperature as rapidly as possible, and a non-solvent of ethanol is added thereto and centrifugation is performed. The supernatant of the solution excluding the centrifuged precipitate is discarded, and the precipitate is dispersed in toluene, to provide a CdSe//ZnS alloy nanocrystal solution emitting a light at 458 nm and having a size of 5 nm.

Separately, 8 g of TOA, 0.1 g of oleic acid, 0.05 mmol of cadmium oxide, and 0.4 mmol of zinc acetate are simultaneously introduced into a 125 ml flask mounted with a reflux condenser, and the reaction temperature is controlled to 300° C. while agitating the mixture. Then, 1 wt % of the synthesized CdSe//ZnS nanocrystal solution is added into this reactant, and 2 mL of the 0.4 M S-TOP complex solution is slowly added thereto and reacted for about 1 hour to grow CdSZnS nanocrystals on the surface of CdSe//ZnS nanocrystals, and to provide a CdSe//ZnS/CdSZnS nanocrystal emitting light at 532 nm.

After completing the reaction, the reaction mixture is cooled to room temperature as rapidly as possible, and a non-solvent of ethanol is added thereto and centrifugation is performed. The supernatant of the solution excluding the centrifuged precipitate is dispersed in toluene, to synthesize a CdSe//ZnS/CdSZnS nanocrystal solution. It is confirmed that the quantum efficiency of the nanocrystal is about 93%.

Preparation Example 2

Synthesis of Red Semiconductor Nanocrystal 200 g of TOA, 5.4 g of oleic acid, and 0.618 g of cadmium oxide are simultaneously introduced into a round flask mounted with a reflux condenser. The mixture is heated to 300° C. while being agitated. Separately, Se powder is dissolved in TOP, to provide a 0.2 M Se-TOP complex solution. 6 mL of the 0.2 M Se-TOP complex solution is rapidly injected into the reaction mixture that is agitated at 300° C. and reacted for 1 minute 30 seconds.

A mixture of 2.4 mmol of octanethiol and 2 mL of TOA is slowly added dropwise to the reaction mixture and reacted for 30 minutes.

About 16 mmol of zinc acetate is dissolved in 4 mL of TOA, and the solution is slowly added dropwise to the reaction mixture. A mixture of 20 mmol of octanethiol and 4 mL of TOA is slowly added dropwise to the mixture and reacted for 60 minutes.

After completing the reaction, the temperature of the reaction mixture is cooled as rapidly as possible to room temperature, and a non-solvent of ethanol is added, and centrifugation is performed. The supernatant of the solution excluding the centrifuged precipitate is discarded, and the precipitate is dispersed in toluene, to provide a CdSe/CdS/ZnS nanocrystal solution including 3 g of the CdSe/CdS/ZnS nanocrystals dispersed in toluene. The synthesized nanocrystal has a light emitting wavelength of 602 nm and quantum efficiency of 76%.

Example 1

Preparation of Semiconductor Nanocrystal-Polymer Micronized Composite

A green semiconductor nanocrystal, prepared according to Preparation Example 1, with a light emitting wavelength of 526 nm is dispersed in toluene to provide a semiconductor nanocrystal dispersion having an optical density ("OD"), e.g. an absorption degree at the first absorption maximum wavelength in a ultraviolet-visible ("UV-Vis") absorption spectrum, of 0.04. Separately, about 1 g of a polyethylene-co-polyacrylic acid polymer with a weight average molecular weight of 2000 grams/mole is dissolved in 4 mL of toluene to provide a polymer solution. The polymer solution is heated to about 100° C., and 4 mL of the semiconductor nanocrystal dispersion is added dropwise thereto and reacted for 30 minutes. After completing the reaction, the temperature of the solution is cooled to about 50° C. The resultant precipitate is filtered and washed several times with hexane. The dried precipitate is ground with a mortar, washed with hexane again, and vacuum-dried for 12 hours, to provide a powder.

The dried powder is milled in a cryogenic specimen container at 77 K for 20 minutes. The specimen container is placed in a glove box under a nitrogen atmosphere, and a temperature of the resulting material obtained from the cryogenic milling is raised to room temperature, to provide a semiconductor nanocrystal-polymer micronized composite.

Example 2

Preparation of Semiconductor Nanocrystal-Polymer Micronized Composite

A green semiconductor nanocrystal, prepared according to Preparation Example 1, with a light emitting wavelength of 526 nm is dispersed in toluene to provide a semiconductor nanocrystal dispersion having an optical density ("OD"), e.g. an absorption degree at the first absorption maximum wavelength in a UV-Vis absorption spectrum of 0.04. Separately, 1 g of a polyethylene-co-polyacrylic acid polymer with a weight average molecular weight of 2000 grams/mole is dissolved in 4 mL of toluene to provide a polymer solution. The polymer solution is heated to 100° C., and 4 mL of the semiconductor nanocrystal dispersion is added dropwise thereto and reacted for 30 minutes. About 5 mL of a 0.2 M zinc acetate solution in toluene, is added dropwise to the reaction mixture and reacted for an additional 30 minutes while controlling the reaction temperature to 100° C. After completing the reaction, the temperature of the solution is cooled to about 50° C. The resultant precipitate is filtered and washed several times with hexane. The dried precipitate is ground with a mortar, washed with hexane again, and vacuum-dried for 12 hours, to provide a powder.

The dried powder is milled in a cryogenic specimen container at 77 K for 20 minutes. The specimen container is placed in a glove box under a nitrogen atmosphere, and a temperature of the resulting material obtained from the cryogenic milling is raised to room temperature, to provide a nanocrystal-polymer micronized composite.

Example 3

Preparation of Semiconductor Nanocrystal-Polymer Micronized Composite

A semiconductor nanocrystal-polymer micronized composite obtained from Example 1, is sieved through a sieve with 45 micrometer (μm) holes, to provide a semiconductor nanocrystal-polymer micronized composite.

Example 4

Preparation of Semiconductor Nanocrystal-Polymer Micronized Composite

A semiconductor nanocrystal-polymer micronized composite obtained from Example 2, is sieved through a sieve with 45 micrometer (μm) holes, to provide a semiconductor nanocrystal-polymer micronized composite.

Example 5

Preparation of Semiconductor Nanocrystal-Polymer Micronized Composite

A semiconductor nanocrystal-polymer micronized composite is prepared according to the same method as Example 1 except for using a red semiconductor nanocrystal with a light emitting wavelength of 623 nm instead of the green semiconductor nanocrystal prepared according to Preparation Example 1.

Example 6

Preparation of Semiconductor Nanocrystal-Polymer Micronized Composite

A semiconductor nanocrystal-polymer micronized composite is prepared according to the same method as Example 2 except for using a red semiconductor nanocrystal with a light emitting wavelength of 623 nm instead of the green semiconductor nanocrystal prepared according to Preparation Example 1.

Example 7

Preparation of Semiconductor Nanocrystal-Polymer Micronized Composite

The semiconductor nanocrystal-polymer micronized composite according to Example 1 is mixed with a silicone resin as an encapsulation polymer, and the mixture is milled in a cryogenic specimen container at 77 K for 20 minutes. The specimen container is placed in a glove box under a nitrogen atmosphere, and a temperature of the resulting material obtained from the cryogenic milling is raised to room temperature. The resultant dried material is sieved through a sieve with 45 micrometer (μm) holes, to provide a semiconductor nanocrystal-polymer micronized composite.

Comparative Example 1

Preparation of Semiconductor Nanocrystal-Polymer Composite

A green semiconductor nanocrystal, with a light-emitting wavelength of 526 nm, is dispersed in toluene to provide a semiconductor nanocrystal dispersion having an optical density ("OD"), e.g. an absorption degree at the first absorption maximum wavelength in a UV-Vis absorption spectrum, of 0.04. Separately, about 1 g of a polyethylene-co-polyacrylic acid polymer with a weight average molecular weight of 2000 grams/mole is dissolved in 4 mL of toluene. The solution is heated up to 100° C., and 4 mL of the semiconductor nanocrystal dispersion is added dropwise thereto and reacted for 30 minutes. After completing the reaction, the temperature of the solution is cooled to 50° C. The resultant precipitate is filtered and washed several times with hexane. The dried precipitate is ground into small pieces, washed with hexane again, and vacuum-dried for 12 hours.

Comparative Example 2

Preparation of Semiconductor Nanocrystal-Polymer Composite

A semiconductor nanocrystal-polymer micronized composite is prepared according to the same method as Comparative Example 1 except for using a red semiconductor nanocrystal with a light-emitting wavelength of 623 nm instead of the green semiconductor nanocrystal.

Example 8

Fabrication of Light Emitting Diode ("LED")

OE6630A and OE6630B made by Dow Corning Co. are mixed in a weight ratio of 1:4 and vapor is removed from the mixture to provide a matrix resin. The semiconductor nanocrystal-polymer micronized composite obtained from Example 1 and the semiconductor nanocrystal-polymer micronized composite obtained from Example 5 are mixed in a weight ratio of 4.5:1 and then uniformly mixed with the matrix resin. A 3.5 mg of the resultant mixture is coated on a blue light emitting diode light source having a surface mount device ("SMD") shape and cured at 150° C. for 2 hours to provide a light emitting diode including the photoconversion layer.

Example 9

Fabrication of Light Emitting Diode ("LED")

pentaerythritol tetrakis (3-mercaptopropionate)) and 1,3,5-triallyl-1,3,5-triazine-2,4,6-trione are mixed in a mole ratio of 1:1, and mixed with 1 wt % of oxy-phenyl-acetic acid 2-[2-oxo-2-phenyl-acetoxy-ethoxy]-ethyl ester, a photoinitiator, to provide a solution.

0.5 mL of the solution is coated on the light emitting diode obtained from Example 8 and exposed to i-line UV at a rate of 100 milliwatts per centimeter squared (mW/cm$^2$) for 10 minutes, to provide a light emitting diode including a polymer film.

Comparative Example 3

Fabrication of Light Emitting Diode ("LED")

A light emitting diode is fabricated according to the same method as Example 6 except for using a mixture of the semiconductor nanocrystal-polymer composites obtained from Comparative Examples 1 and 2 in a weight ratio of about 4.5:1, instead of the semiconductor nanocrystal-polymer micronized composites obtained from Examples 1 and 5.

Figure 10:
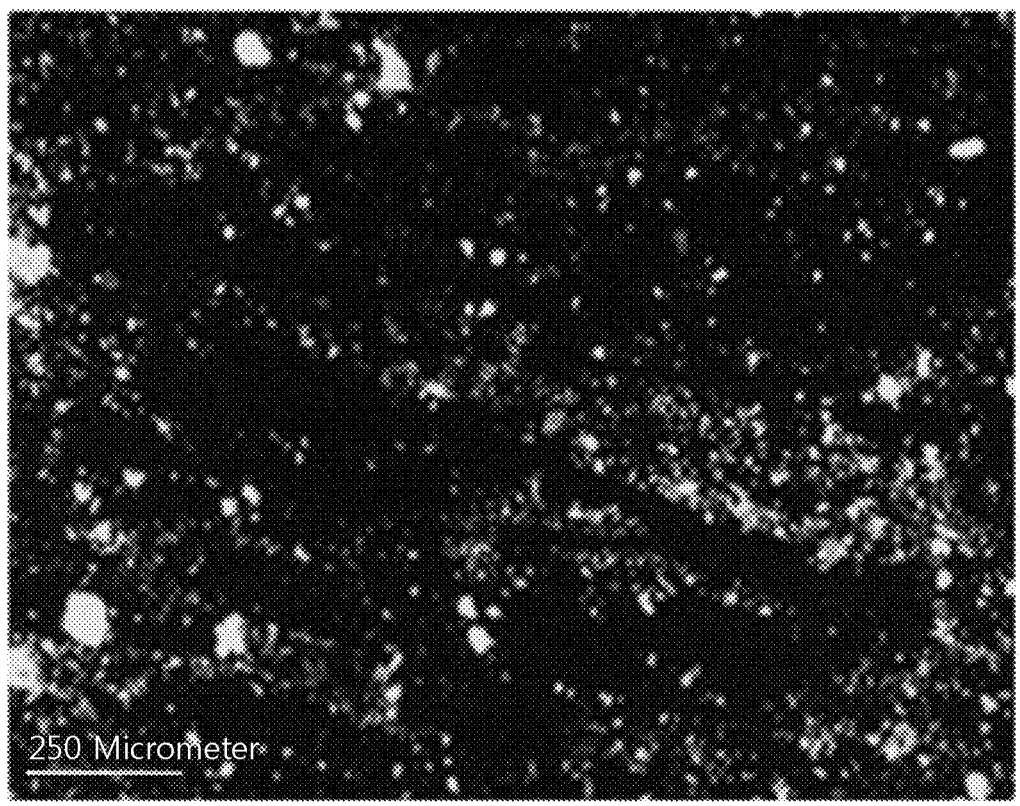
FIG. 10 is an optical microscope photograph showing the semiconductor nanocrystal-polymer micronized composite according to Example 1.
Figure 11:
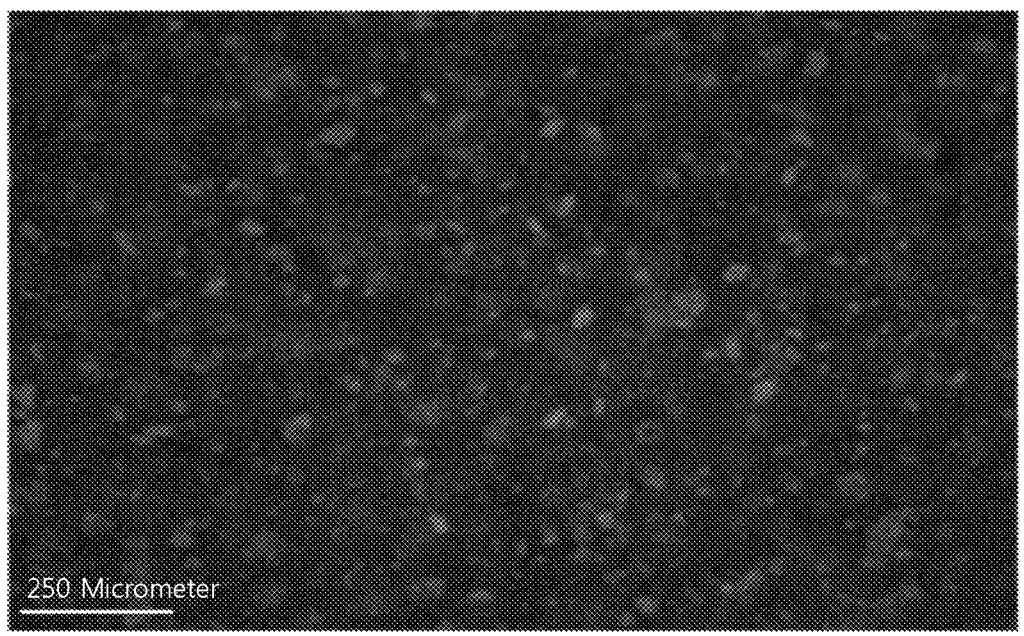
FIG. 11 is an optical microscope photograph showing the semiconductor nanocrystal-polymer micronized composite according to Example 7.
Figure 12:
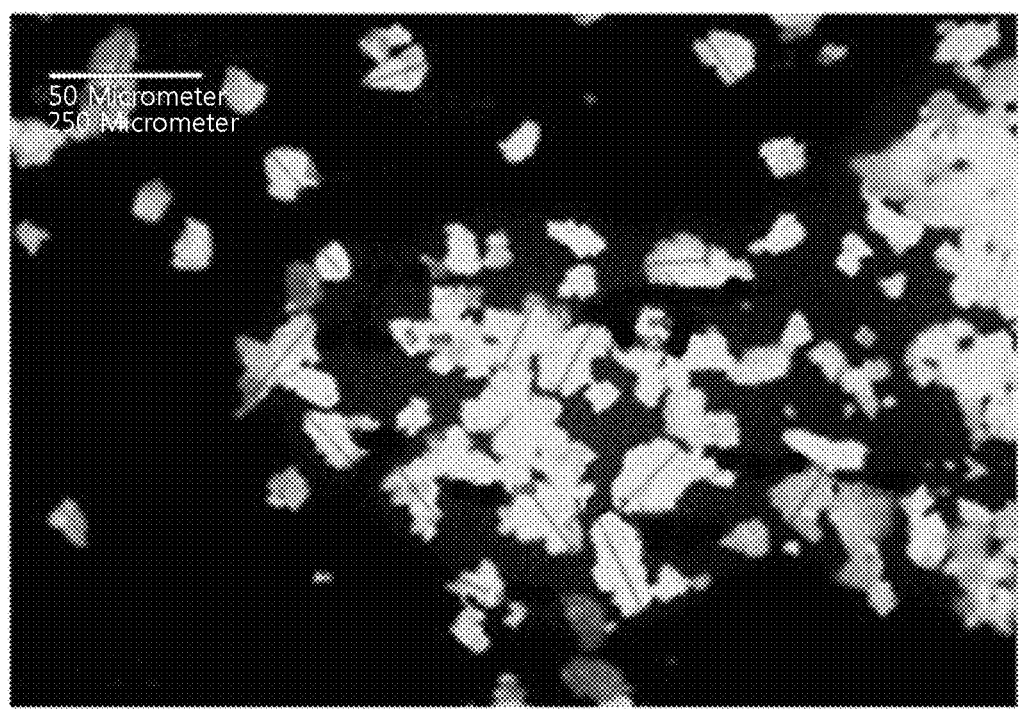
FIG. 12 is an optical microscope photograph showing the semiconductor nanocrystal-polymer micronized composite according to Comparative Example 1.

FIGS. 10 and 11 show optical microscope photographs of the semiconductor nanocrystal-polymer micronized composites according to Examples 1 and 7, respectively. FIG. 12 shows an optical microscope photograph of the semiconductor nanocrystal-polymer composite prepared without cryogenic milling according to Comparative Example 1. As shown in FIGS. 10 and 11, the semiconductor nanocrystal-polymer composites prepared through cryogenic milling according to Examples 1 and 7 each have a particle diameter of less than or equal to about 50 micrometers, compared to the semiconductor nanocrystal-polymer composite according to Comparative Example 1 as shown in FIG. 12, which has a particle diameter of about 100 micrometers.

The semiconductor nanocrystal-polymer micronized composite according to Examples 1 and 7, and the semiconductor nanocrystal-polymer composite according to Comparative Example 1 are measured in terms of average particle diameter, standard deviation, and aspect ratio. The results are provided in the following Table 1.

TABLE 1

|  | Average particle diameter | Standard deviation | Aspect ratio |
|---|---|---|---|
| Example 1 | 30 μm | 8.4 μm | 1.53 |
| Comparative Example 1 | 108.1 μm | 36.1 μm | 1.70 |
| Example 7 | 37.5 μm | 10.2 μm | 1.33 |

Figure 13:
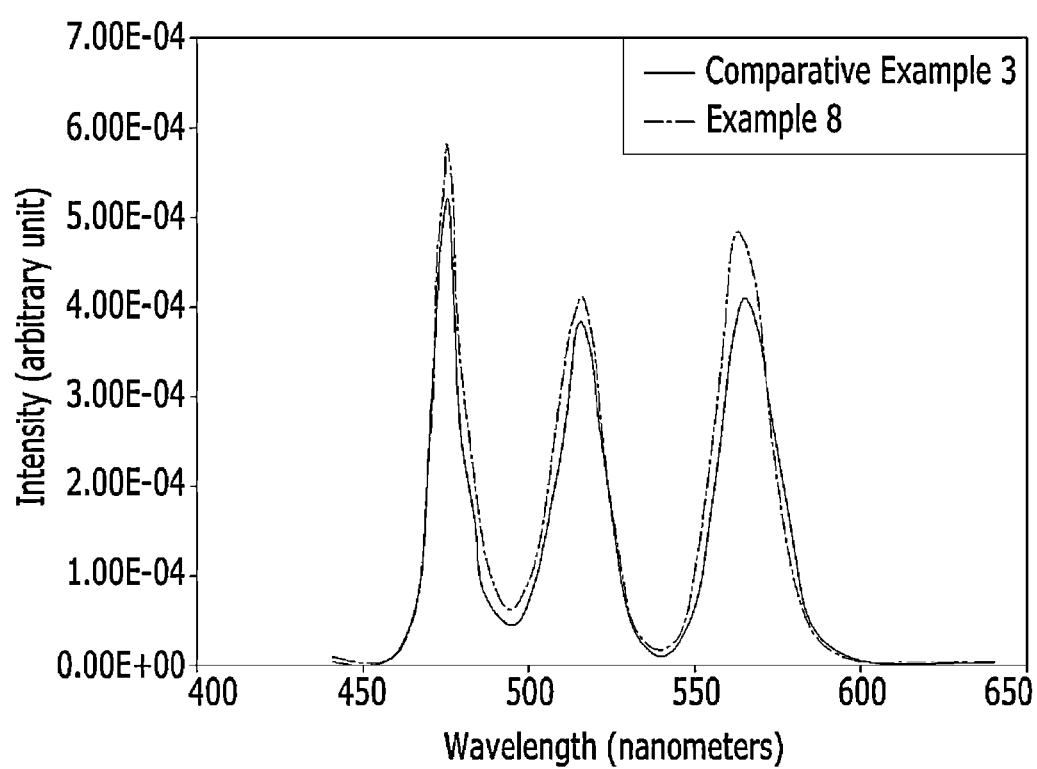
FIG. 13 is a graph illustrating intensity (arbitrary units) versus wavelength (nanometers) of the light emitting diodes according to Example 8 and Comparative Example 3.

The light emitting diodes according to Example 8 and Comparative Example 3 are operated with a current of 120 milliamps (mA) and measured in terms of light emitting wavelength. The results are provided in FIG. 13. As shown in FIG. 13, the light emitting diode according to Comparative Example 3 has a light emitting wavelength that is moved somewhat toward red from the original wavelength of a semiconductor nanocrystal. The light emitting diode according to Example 8 has excellent luminance intensity compared with the light emitting diode according to Comparative Example 3, and emits light at the original light emitting wavelength of a semiconductor nanocrystal.

Figure 14:
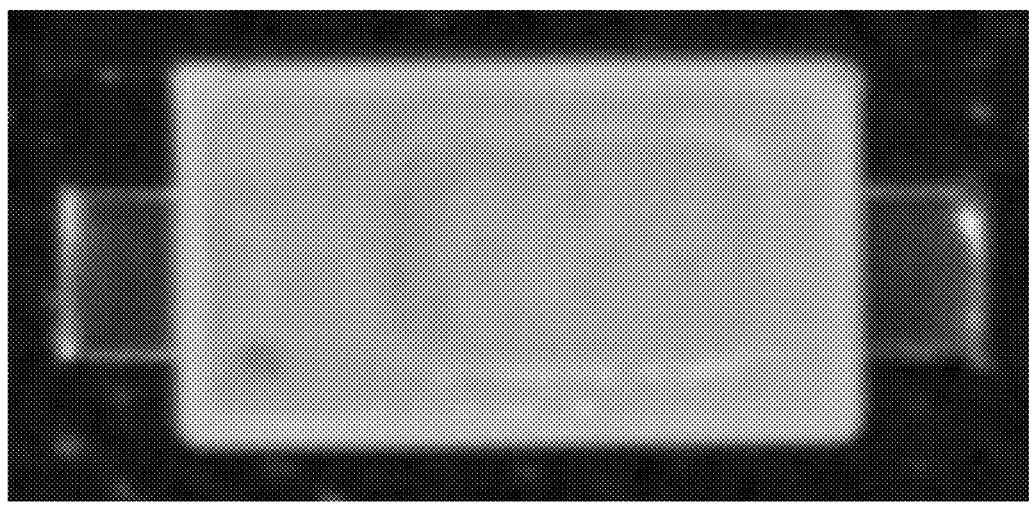
FIGS. 14 and 15 are optical photographs showing the light emitting diodes according to Example 8 and Comparative Example 3, respectively.
Figure 15:
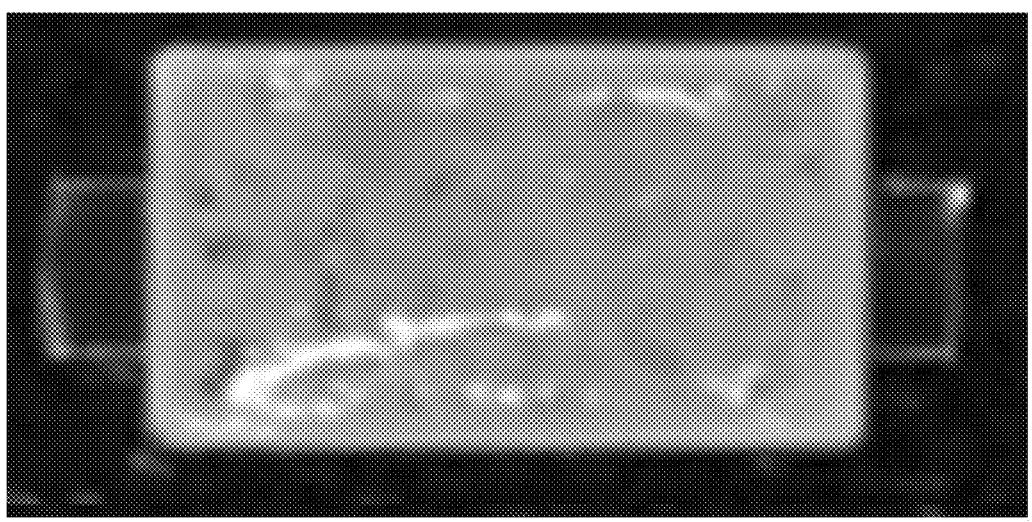

As shown in FIG. 14, the light emitting diode according to Example 8 shows that semiconductor nanocrystals are uniformly mixed. On the contrary, the light emitting diode according to Comparative Example 3 as shown in FIG. 15, shows that green and red semiconductor nanocrystals are not uniformly mixed.

The light emitting diodes according to Example 8 and Comparative Example 3 are operated with a current of 120 mA and measured in terms of luminance measured in lumen (lm), color coordinate Cx and Cy, and efficiency measured in lumen per Watt (lm/W). The results are provided in the following Table 2.

TABLE 2

|  | Luminance (lm) | Color coordinate (Cx) | Color coordinate (Cy) | Efficiency (lm/W) |
|---|---|---|---|---|
| Comparative Example 3 | 13.4 | 0.3117 | 0.3028 | 33.2 |
| Example 8 | 15.5 | 0.3167 | 0.3032 | 38.5 |

As shown in Table 2, the light emitting diode according to Example 8 has increased luminance and efficiency, and improved color purity compared with the light emitting diode according to Comparative Example 3.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A semiconductor nanocrystal-polymer micronized composite, comprising:
 a plurality of semiconductor nanocrystals; and
 a solid polymer matrix,
 wherein the solid polymer matrix comprises a polymer having at least one functional group directly bound to the semiconductor nanocrystal,
 wherein the plurality of semiconductor nanocrystals is dispersed throughout the solid polymer matrix,
 wherein the at least one functional group directly bound to the semiconductor nanocrystal is selected from a carboxyl group (—C(=O)OH), a carboxylate group (—C(=O)OR', wherein R' is a monovalent to trivalent metal ion), a carboxylate group —RC(=O)OR' group (wherein R is a substituted or unsubstituted C1 to C10 alkylene group, and R' is a monovalent to trivalent metal ion), a substituted or unsubstituted C2 to C20 alkenyl group, a substituted or unsubstituted C2 to C20 alkynyl group, a halogen, an —ROR' group (wherein R is a substitute or unsubstituted C1 to C10 alkylene group, and R' is a monovalent organic functional group or a monovalent to trivalent metal ion), and acyl halide group (—RC(=O)X, wherein R is a substituted or unsubstituted C1 to C10 alkylene group, and X is a halogen), an amide group (—C(=O)NR', wherein R' is hydrogen, a monovalent organic functional group, or a monovalent to trivalent metal ion), an imine group (—C(=NR')—, wherein R' is hydrogen, a monovalent organic functional group, or a monovalent to trivalent metal ion), an imide group (—C(=O)N(R')(=O)—, wherein R' is hydrogen, a monovalent organic functional group, or a monovalent to trivalent metal ion), an isocyanate group (—N=C=O), a phosphine oxide group (—P(=O)R'R", wherein R' and R" are each independently hydrogen, a monovalent organic functional group, or a monovalent to trivalent metal ion), a sulfonate group (—SO$_3$R', wherein R' is hydrogen, a monovalent organic functional group, or a monovalent to trivalent metal ion), a nitro group (—NO$_2$), and a combination thereof, and
 wherein the semiconductor nanocrystal-polymer micronized composite has a particle diameter of less than or equal to about 70 micrometers with a standard deviation of less than or equal to about 20 micrometers, and an aspect ratio of greater than about 1.0 and less than or equal to about 10.
2. The semiconductor nanocrystal-polymer micronized composite of claim 1, wherein the semiconductor nanocrystal is selected from a Group II-VI compound, a Group III-V compound, a Group IV-VI compound, and a combination thereof.
3. The semiconductor nanocrystal-polymer micronized composite of claim 1, wherein the polymer comprises a main chain selected from a polyacrylate, a polymethacrylate, a polyacrylic acid, a polyacrylic acid salt, a polymethacrylic acid, a polymethacrylic acid salt, a polyolefin, poly(alkylene-co-acrylic acid), a poly(alkylene-co-acrylic acid salt), a poly(alkylene-co-methacrylic acid), a poly(alkylene-co-methacrylic acid salt), a polyamide, a polyimide, a polyisocyanate, a polythiol, a polyester, a polyamideimide, a polyetherimide, a polyacrylonitrile, a polyarylene ether, a polyarylene sulfide, a polyarylene sulfone, a polybenzoxazole, polybenzothiazole, a polybutadiene, a polycarbonate, a polycarbonate ester, a polyether ketone, a polyether ether ketone, a polyether ketone ketone, a polyethersulfone, a polyisoprene, a polyphosphazene, a polystyrene, a rubber-modified polystyrene, a polyoxadiazole, a polysilazane, polysulfone, a polysulfonamide, a polyvinyl acetate, a polyvinyl chloride, a polyvinyl ester, a polyvinyl ether, a polyvinyl halide, a polyvinyl nitrile, a polyvinyl thioether, a polyurea, a polyurethane, an epoxy, an ethylene propylene diene rubber, ethylene propylene diene monomer rubber, a melamine, a silicone, and a combination thereof.

4. The semiconductor nanocrystal-polymer micronized composite of claim 1, wherein the polymer has a Shore D hardness of greater than or equal to about 20 and less than and equal to about 90 measured according to ASTM D2240-05.

5. The semiconductor nanocrystal-polymer micronized composite of claim 1, wherein the polymer has a Shore D hardness of greater than or equal to about 25 and less than or equal to about 70 measured according to ASTM D2240-05.

6. The semiconductor nanocrystal-polymer micronized composite of claim 1, which has a particle diameter of about 5 micrometers (μm) to about 65 micrometers, and a standard deviation of less than or equal to about 15 micrometers.

7. The semiconductor nanocrystal-polymer micronized composite of claim 1, which further comprises an encapsulation polymer surrounding at least one of the semiconductor nanocrystal-polymer micronized composite; and wherein the encapsulation polymer is selected from a silicone resin; and epoxy resin; a poly(meth)acrylate polymer; an organic/inorganic hybrid polymer; a polycarbonate; a polystyrene; a polyolefin; a polymerized product of a first monomer comprising at least two thiol (—SH) groups, and a second monomer comprising at least two carbon-carbon unsaturated bond-containing groups; and a combination thereof.

8. The semiconductor nanocrystal-polymer micronized composite of claim 1, which comprises about 1 to about 50 weight percent (wt %) of the plurality of semiconductor nanocrystals, based on the total weight of the semiconductor nanocrystal-polymer micronized composite.

9. An optoelectronic device comprising the semiconductor nanocrystal-polymer micronized composite according to claim 1.

10. The optoelectronic device of claim 9, wherein the optoelectronic device is a light emitting device comprising:
 a light source; and
 a light converting layer disposed on the light source, wherein the light converting layer comprises
 a matrix, and
 the semiconductor nanocrystal-polymer micronized composite according to claim 1 dispersed in the matrix.

11. The optoelectronic device of claim 10, wherein at least one of the semiconductor nanocrystal-polymer micronized composite particles is surrounded by an encapsulation polymer to provide an encapsulated semiconductor nanocrystal-polymer micronized composite, and the encapsulated composite is dispersed in the matrix.

12. The optoelectronic device of claim 11, wherein the encapsulation polymer is selected from a silicone resin; an epoxy resin; a poly(meth)acrylate polymer; an organic/inorganic hybrid polymer; a polycarbonate; a polystyrene; a polyolefin; a polymerized product of a first monomer comprising at least two thiol (—SH) groups, and a second monomer comprising at least two carbon-carbon unsaturated bond-containing groups; and a combination thereof.

13. The optoelectronic device of claim 12, wherein the organic/inorganic hybrid polymer comprises a first moiety including a siloxane bond (—Si—O—Si—), a second moiety including a siloxane bond and at least one organic functional group, and a third moiety including a siloxane bond and a cross-linked residue of at least one reactive functional group.

14. The optoelectronic device of claim 13, wherein the organic/inorganic hybrid polymer further comprises a fourth moiety comprising an —O-M-O— bond wherein M is selected from Al, Sn, Ti, Zr, Ge, B, and a combination thereof.

15. The optoelectronic device of claim 9, wherein the optoelectronic device comprises a light emitting device comprising:
 a light source;
 a first matrix disposed on the light source;
 a transparent plate disposed on the first matrix opposite the light source; and
 a light converting layer disposed on the transparent plate opposite the first matrix layer, wherein the light converting layer comprises
 a second matrix, and
 a semiconductor nanocrystal-polymer micronized composite according to claim 1 dispersed in the second matrix.

16. The optoelectronic device of claim 15, wherein the light emitting device further comprises an outer polymer film disposed on the light converting layer opposite the transparent plate, wherein the outer polymer film comprises a polymerized product of a first monomer comprising at least two thiol (—SH) groups, and a second monomer comprising at least two carbon-carbon unsaturated bond-containing groups.

17. The optoelectronic device of claim 15, wherein the light emitting device further comprises an outer polymer film disposed on the light converting layer opposite the transparent layer and in inner polymer film disposed between the outer polymer fill and the light converting layer, wherein
 the inner polymer film comprises a polymerized product of a first monomer including at least two thiol (—SH) groups and a siloxane-based second monomer or oligomer including at least one carbon-carbon unsaturated bond, and
 the outer polymer film comprises a polymerized product of a third monomer including at least two thiol (—SH) groups and a fourth monomer including at least two carbon-carbon unsaturated bonds.

18. A method of preparing a semiconductor nanocrystal-polymer micronized composite, the method comprising:
 providing a polymer solution comprising a polymer;
 adding a plurality of semiconductor nanocrystals to the polymer solution to react the semiconductor nanocrystal with the polymer to form a reaction product;
 filtering the reaction product;
 drying the reaction product; and
 cryogenic-milling the dried reaction product to provide the semiconductor nanocrystal-polymer micronized composite comprising a solid matrix comprising the polymer with the plurality of semiconductor nanocrystals dispersed throughout the solid polymer matrix,
 wherein the polymer comprises at least one functional group directly bound to the semiconductor nanocrystal, and the semiconductor nanocrystal-polymer micronized composite has a particle diameter of less than or equal to about 70 micrometers, with a standard deviation of less than or equal to about 20 micrometers, and an aspect ratio of greater than about 1.0 and less than or equal to about 10.

19. The method of claim 18, wherein the semiconductor nanocrystal is selected from a Group II-VI compound, a Group III-V compound, a Group IV-VI compound, and a combination thereof.

20. The method of claim 18, wherein the at least one functional group directly bound to the semiconductor nanocrystals is selected from a carboxyl group (—C(=O)OH), an ester group (—C(=O)OR', wherein R' is a monovalent organic functional group, or a monovalent to trivalent metal ion), an (—RC(=O)OR' group (wherein R is a substituted or unsubstituted C1 to C10 alkylene group, and R' is hydrogen, a monovalent organic functional group, or a monovalent to trivalent metal ion), a substituted or unsubstituted C2 to C20 alkenyl group, a substituted or unsubstituted C2 to C20 alkynyl group, a halogen, an —ROR' group (wherein R is a substituted or unsubstituted C1 to C10 alkylene group, and R' is hydrogen, a monovalent organic functional group, or a monovalent to trivalent metal ion), an acyl halide group (—RC(=O)X, wherein R is a substituted or unsubstituted C1 to C10 alkylene group, and X is a halogen), an amide group (—C(=O)NR' wherein R' is hydrogen, a monovalent organic functional group, or a monovalent to trivalent metal ion), an amine group (—NR'R", wherein R' and R" are each independently hydrogen, a monovalent organic functional group, or a monovalent to trivalent metal ion), an imine group (—C(=NR')— wherein R' is hydrogen, a monovalent organic functional group, or a monovalent to trivalent metal ion), an imide group (—C(=O)N(R')C(=O)— wherein R' is hydrogen, a monovalent organic functional group, or a monovalent to trivalent metal ion), an isocyanate group (—N=C=O), an acrylate group (—OC(=O)—C(H)=CH$_2$), a methacrylate group (—OC(=O)—C(CH$_3$)=CH$_2$), a thiol group (—SH), a phosphine oxide group (—P(=O)R'R", wherein R' and R" are each independently hydrogen, a monovalent organic functional group, or a monovalent to trivalent metal ion), a sulfonate group (—SO$_3$R, wherein R' is hydrogen, a monovalent organic functional group, or a monovalent to trivalent metal ion), a nitro group (—NO$_2$), and a combination thereof.

21. The method of claim 18, wherein the polymer comprises a main chain selected from a polyacrylate, a polymethacrylate, a polyacrylic acid, a polyacrylic acid salt, a polymethacrylic acid, a polymethacrylic acid salt, a polyolefin, a poly(alkylene-co-acrylic acid), a poly(alkylene-co-acrylic acid salt), a poly(alkylene-co-methacrylic acid), a poly(alkylene-co-methacrylic acid salt), a polyamide, a polyimide, a polyisocyanate, a polythiol, a polyester, a polyamideimide, a polyetherimide, a polyacrylonitrile, a polyarylene ether, a polyarylene sulfide, a polyarylene sulfone, a polybenzoxazole, a polybenzothiazole, a polybutadiene, a polycarbonate, a polycarbonate ester, a polyether ketone, a polyether ether ketone, a polyether ketone ketone, a polyethersulfone, a polyisoprene, a polyphosphazene, a polystyrene, a rubber-modified polystyrene, a polyoxadiazole, a polysilazane, polysulfone, a polysulfonamide, a polyvinyl acetate, a polyvinyl chloride, a polyvinyl ester, a polyvinyl ether, a polyvinyl halide, a polyvinyl nitrile, a polyvinyl thioether, a polyurea, a polyurethane, an epoxy, an ethylene propylene diene rubber, ethylene propylene diene monomer rubber, a melamine, a silicone, and a combination thereof.

22. The method of claim 18, further comprising raising a temperature of the semiconductor nanocrystal-polymer micronized composite obtained from the cryogenic milling, from the cryogenic milling temperature to a temperature of about 23° C. to about 25° C.; and sieving the semiconductor nanocrystal-polymer micronized composite having the raised temperature.

23. The method of claim 18, further comprising a secondary cryogenic milling of the semiconductor nanocrystal-polymer micronized composite.

24. The method of claim 18, wherein the cryogenic milling is performed at about 10 kelvin to about 273 kelvin.

25. The method of claim 24, wherein the cryogenic milling is performed at about 10 kelvin to about 150 kelvin.

* * * * *